US011705479B2

(12) United States Patent
Choi et al.

(10) Patent No.: US 11,705,479 B2
(45) Date of Patent: *Jul. 18, 2023

(54) DISPLAY APPARATUS AND METHOD OF MANUFACTURING THE SAME

(71) Applicant: SAMSUNG ELECTRONICS CO., LTD., Suwon-si (KR)

(72) Inventors: Junhee Choi, Seongnam-si (KR); Sungjin Kang, Seoul (KR); Kiho Kong, Suwon-si (KR); Junghun Park, Yongin-si (KR); Jinjoo Park, Yongin-si (KR); Joohun Han, Hwaseong-si (KR); Kyungwook Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 49 days.

This patent is subject to a terminal disclaimer.

(21) Appl. No.: 17/400,354

(22) Filed: Aug. 12, 2021

(65) Prior Publication Data

US 2021/0375983 A1    Dec. 2, 2021

Related U.S. Application Data

(62) Division of application No. 16/589,359, filed on Oct. 1, 2019, now Pat. No. 11,121,171.

(30) Foreign Application Priority Data

Nov. 27, 2018   (KR) ........................ 10-2018-0148772

(51) Int. Cl.
*H01L 27/15*      (2006.01)
*H01L 33/00*      (2010.01)
(Continued)

(52) U.S. Cl.
CPC ........ *H01L 27/156* (2013.01); *H01L 33/0093* (2020.05); *H01L 33/145* (2013.01);
(Continued)

(58) Field of Classification Search
CPC . H01L 27/156; H01L 33/0093; H01L 33/145; H01L 33/22; H01L 33/405;
(Continued)

(56) References Cited

U.S. PATENT DOCUMENTS 9,899,418 B2    2/2018   Pfeuffer et al.
10,008,645 B2   6/2018   Bonar et al.
(Continued)

FOREIGN PATENT DOCUMENTS

KR    10-2017-0096471 A    8/2017
KR    10-2018-0052977 A    5/2018
(Continued)

OTHER PUBLICATIONS

Communication dated Apr. 21, 2020 issued by the European Intellectual Property Office in counterpart European Application No. 19201136.9.
(Continued)

*Primary Examiner* — Victor A Mandala
(74) *Attorney, Agent, or Firm* — Sughrue Mion, PLLC

(57) ABSTRACT

Provided are a display apparatus and a method of manufacturing the same. The display apparatus includes a support substrate, a driving layer provided on the support substrate and including a driving element configured to apply power to a pixel electrode, and a light-emitting layer provided on the driving layer.

10 Claims, 20 Drawing Sheets

(51) Int. Cl.
*H01L 33/14* (2010.01)
*H01L 33/22* (2010.01)
*H01L 33/40* (2010.01)
*H01L 33/42* (2010.01)
*H01L 33/50* (2010.01)
*H01L 33/60* (2010.01)

(52) U.S. Cl.
CPC ............ *H01L 33/22* (2013.01); *H01L 33/405* (2013.01); *H01L 33/42* (2013.01); *H01L 33/504* (2013.01); *H01L 33/60* (2013.01); *H01L 2933/0016* (2013.01); *H01L 2933/0041* (2013.01); *H01L 2933/0058* (2013.01); *H01L 2933/0091* (2013.01)

(58) Field of Classification Search
CPC ....... H01L 33/42; H01L 33/504; H01L 33/60; H01L 2933/0016; H01L 2933/0041; H01L 2933/0058; H01L 2933/0091; H01L 33/14; H01L 25/0753; H01L 25/167; H01L 33/38; H01L 33/48; H01L 2933/0033
See application file for complete search history.

(56) References Cited

U.S. PATENT DOCUMENTS

| | | | | |
|---|---|---|---|---|
| 11,430,374 | B2* | 8/2022 | Choi | ................ H01L 25/0753 |
| 2003/0214567 | A1* | 11/2003 | Kanazawa | ................ B41J 2/41 347/112 |
| 2006/0175621 | A1 | 8/2006 | Ohtsuka et al. | |
| 2011/0140114 | A1* | 6/2011 | Ko | ................ H10K 71/00 438/23 |
| 2012/0176025 | A1* | 7/2012 | Lee | ................ H10K 59/30 313/503 |
| 2014/0042408 | A1* | 2/2014 | Akagawa | ................ H10K 71/00 257/40 |
| 2015/0287959 | A1* | 10/2015 | Hanamura | ................ H10K 50/844 257/40 |
| 2016/0245984 | A1 | 8/2016 | Yu et al. | |
| 2016/0380037 | A1* | 12/2016 | Kajiyama | ................ H10K 59/1213 257/88 |
| 2017/0205543 | A1* | 7/2017 | Yim | ................ B32B 17/00 |
| 2017/0263593 | A1 | 9/2017 | Zou et al. | |
| 2017/0287887 | A1 | 10/2017 | Takeya et al. | |
| 2017/0358503 | A1* | 12/2017 | Liu | ................ B65G 43/08 |
| 2017/0358624 | A1 | 12/2017 | Takeya et al. | |
| 2018/0108874 | A1* | 4/2018 | Tanaka | ................ H10K 50/11 |
| 2018/0158987 | A1* | 6/2018 | Lee | ................ H01L 33/32 |
| 2018/0190672 | A1* | 7/2018 | Lee | ................ H01L 27/124 |
| 2019/0065806 | A1* | 2/2019 | Cheng | ................ G02F 1/134309 |
| 2019/0096960 | A1* | 3/2019 | Lee | ................ H10K 50/805 |
| 2019/0198585 | A1* | 6/2019 | Chang | ................ G09G 3/32 |
| 2019/0214376 | A1* | 7/2019 | Kim | ................ H01L 27/1259 |
| 2020/0057184 | A1* | 2/2020 | Lin | ................ G02F 1/136286 |
| 2021/0183301 | A1* | 6/2021 | Choi | ................ G09G 3/32 |
| 2021/0280741 | A1* | 9/2021 | Lo | ................ H01L 25/0753 |
| 2022/0109021 | A1* | 4/2022 | Kong | ................ H01L 33/62 |
| 2022/0109022 | A1* | 4/2022 | Choi | ................ H01L 27/156 |
| 2023/0062456 | A1* | 3/2023 | Park | ................ H01L 27/1214 |

FOREIGN PATENT DOCUMENTS

| | | |
|---|---|---|
| WO | 2008/091846 A2 | 7/2008 |
| WO | 2016/079505 A1 | 5/2016 |

OTHER PUBLICATIONS

Jeong-Tak Oh et al., "Light output performance of red AlGaInP-based light emitting diodes with difference chip geometries ad structures", Apr. 30, 2018,Optics Express 11194, vol. 26, No. 9, (7 pages total).

* cited by examiner

DISPLAY APPARATUS AND METHOD OF MANUFACTURING THE SAME

CROSS-REFERENCE TO RELATED APPLICATION

This application is a Divisional Application of U.S. application Ser. No. 16/589,359, filed Oct. 1, 2019, which is based on and claims priority to Korean Patent Application No. 10-2018-0148772, filed on Nov. 27, 2018, in the Korean Intellectual Property Office, the disclosure of which is incorporated by reference herein in its entirety.

BACKGROUND

1. Field

The disclosure relates to high-resolution display apparatuses and methods of manufacturing the same.

2. Description of the Related Art

Liquid crystal displays (LCDs), organic light-emitting diode (OLED) displays, and the like are widely used as display apparatuses. In recent years, a technique for manufacturing a high-resolution display apparatus using a micro LED has attracted attention. LEDs have advantages such as low power consumption and environmental friendliness. Due to these advantages, industrial demand is increasing.

Micro LED displays may be manufactured by forming LEDs and drivers, such as thin film transistors (TFTs) or complementary metal-oxide semiconductor (CMOS) transistors, and bonding the drivers to the LEDs. In this case, defects may occur in electrical connection portions during bonding, and bonding instability may occur due to thermal mismatch.

SUMMARY

Provided are high-resolution display apparatuses.

Provided are methods of manufacturing high-resolution display apparatuses.

Additional aspects will be set forth in part in the description which follows and, in part, will be apparent from the description, or may be learned by practice of the presented embodiments.

According to an aspect of the disclosure, there is provided a display apparatus comprising: a support substrate; a driving layer provided on the support substrate, the driving layer comprising a driving element configured to apply power to a pixel electrode, the pixel electrode configured to apply power to a plurality of subpixels; and a light-emitting layer comprising a first semiconductor layer, an active layer, and a second semiconductor layer provided on the driving layer.

The display apparatus may further comprise a bonding layer between the support substrate and the driving layer.

The display apparatus may further comprise the pixel electrode provided between the driving layer and the light-emitting layer.

The display apparatus may further comprise a common electrode provided on the light-emitting layer.

The support substrate may comprise a silicon substrate, a glass substrate, a sapphire substrate, or a silicon substrate coated with $SiO_2$.

The driving element may comprise a transistor, a thin film transistor (TFT), or a high electron mobility transistor (HEMT).

The pixel electrode may be configured to reflect light emitted from the active layer.

The pixel electrode may comprise Ag, Au, Al, Cr, Ni, or an alloy including at least one of Ag, Au, Al, Cr or Ni.

The light-emitting layer may comprise an isolation structure configured to divide the first semiconductor layer, the active layer, and the second semiconductor layer corresponding to the plurality of subpixels.

The display apparatus may further comprise a current blocking layer provided in a region of the driving layer corresponding to the isolation structure.

The common electrode may comprise a transparent electrode.

The common electrode may comprise a trench structure provided between adjacent subpixels, among the plurality of subpixels.

In a cross-sectional view, a bottom surface of the trench structure may be above a top surface of the active layer facing the second semiconductor layer.

The second semiconductor layer may have a fine pattern structure.

The display apparatus may further comprise a plurality of color conversion layers configured to convert light emitted from the light-emitting layer into differently colored lights.

The display apparatus may further comprise partition walls provided with reflective films between the plurality of color conversion layers.

According to another aspect of the disclosure, there is provided a display apparatus comprising: a support substrate; a driving layer provided on the support substrate and comprising a driving element; a light-emitting layer comprising a first semiconductor layer, an active layer, and a second semiconductor layer stacked on the driving layer, the light-emitting layer having an isolation structure configured to divide light emitted from the active layer into a plurality of subpixels; a first electrode electrically connected to the first semiconductor layer; and a second electrode electrically connected to the second semiconductor layer.

The display apparatus may further comprise a bonding layer provided between the support substrate and the driving layer.

The second electrode may comprise a common electrode.

The second electrode may comprise a transparent electrode and disposed to cover the second semiconductor layer.

The second electrode may comprise: an opaque electrode; and a window region configured to transmit light emitted from the active layer.

The second electrode may comprise a trench structure provided between adjacent subpixels, among the plurality of subpixels.

The trench structure of the second electrode may be configured to reflect light emitted laterally from the active layer.

In a cross-sectional view, a bottom of the trench structure of the second electrode may be above a surface of the active layer facing the second semiconductor layer.

The isolation structure may comprise an ion implantation region.

The display apparatus may further comprise a plurality of color conversion layers configured to convert light emitted from the light-emitting layer into different color lights.

The bonding layer may be provided directly between the support substrate and the driving layer.

According to another aspect of the disclosure, there is provided a method of manufacturing a display apparatus, the method comprising: forming a first semiconductor layer on an epitaxial substrate; forming an active layer on the first semiconductor layer; forming a second semiconductor layer on the active layer; dividing the active layer into a plurality of subpixels; forming a first electrode on the second semiconductor layer; forming a driving layer comprising a driving element electrically connected to the first electrode; bonding the driving layer to a support substrate; removing the epitaxial substrate; and forming a second electrode on the first semiconductor layer.

The dividing of the active layer into the plurality of subpixels may comprise forming an ion implantation region between adjacent subpixels, among the plurality of subpixels.

The first electrode may comprise a reflective material that reflects light.

The driving layer may be bonded to the support substrate by fusion bonding or direct bonding.

The second electrode may be formed as a common electrode.

The second electrode may be formed as a transparent electrode that covers the second semiconductor layer.

The second electrode may be formed as an opaque electrode and comprises a window region to transmit light emitted from the active layer.

The second electrode may comprise a trench structure formed between adjacent subpixels.

The trench structure of the second electrode may be formed to reflect light emitted laterally from the active layer.

In a cross-sectional view, a bottom of the trench structure of the second electrode may be above a surface of the active layer facing the second semiconductor layer.

The method may further comprise forming a plurality of color conversion layers configured to convert light emitted from the active layer into different color lights, so as to correspond to the plurality of subpixels.

The first electrode may be formed to face the active layer.

The method may further comprise forming a fine pattern structure in the second semiconductor layer at a position corresponding to the active layer.

According to another aspect of the disclosure, there is provided a semiconductor device comprising: a support substrata driving layer provided on the support substrate in a flip chip manner, the driving layer comprising a plurality of driving elements, each of the plurality of driving elements configured to drive a subpixel, among a plurality of subpixels; and a light emitting layer provided on the driving layer, the light emitting layer being divided into the plurality of subpixels.

According to another aspect of the disclosure, there is provided a method of forming a monolithic semiconductor device comprising: forming a light emitting layer, the light emitting layer being divided into a plurality of subpixels; forming a driving layer on the light emitting layer, the driving layer comprising a plurality of driving elements, each of the plurality of driving elements configured to drive a subpixel, among the plurality of subpixels; and bonding the driving layer to a support substrate using a flip chip method.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
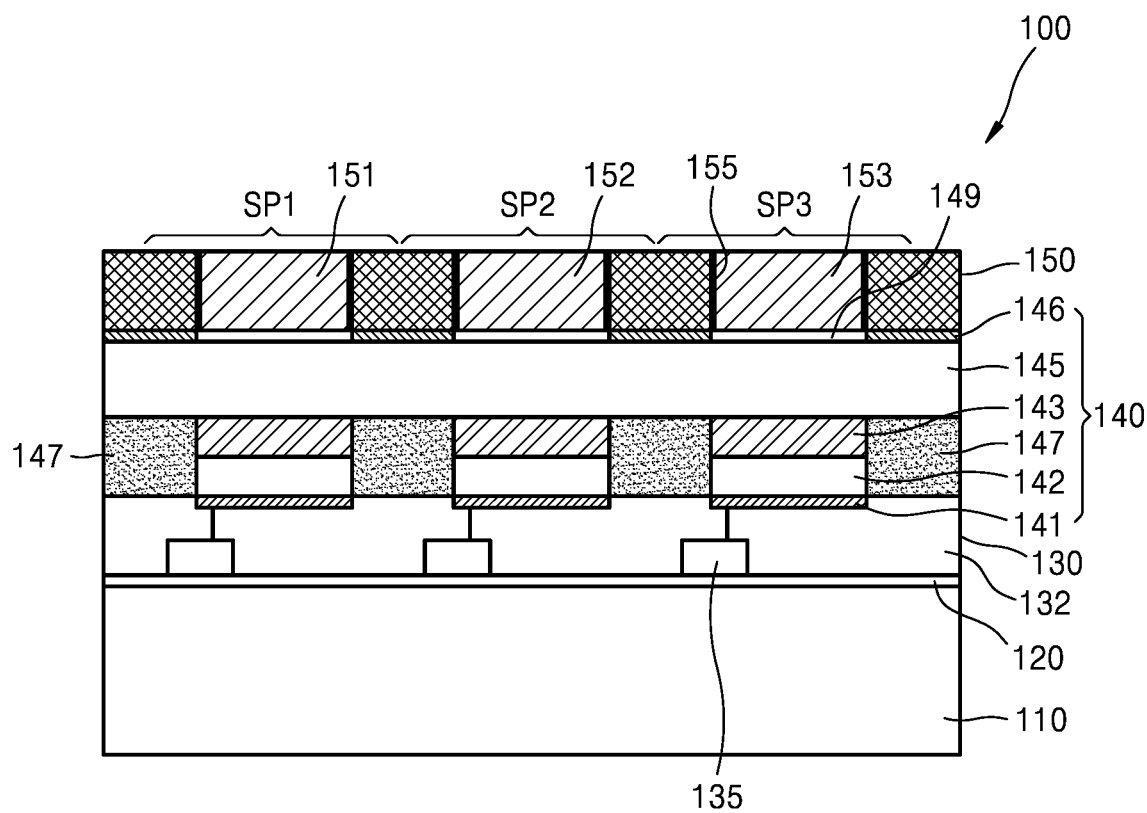
FIG. 1 schematically illustrates a display apparatus according to an embodiment.

Reference will now be made in detail to embodiments, examples of which are illustrated in the accompanying drawings, wherein like reference numerals refer to like elements throughout. In this regard, the embodiments of the disclosure may have different forms and should not be construed as being limited to the descriptions set forth herein. Accordingly, the embodiments are merely described below, by referring to the figures, to explain aspects.

Hereinafter, display apparatuses and methods of manufacturing the same, according to various embodiments, will be described with reference to the accompanying drawings. Sizes of components in the drawings may be exaggerated for clarity and convenience of explanation. Also, it will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise. It will also be understood that the terms "comprises", "includes", and "has", when used herein, specify the presence of stated elements, but do not preclude the presence or addition of other elements, unless otherwise defined. Sizes or thicknesses of components in the drawings may be exaggerated for clarity convenience of explanation. It will be understood that when a certain material layer is referred to as being "on" a substrate or another layer, it may be directly formed on the substrate or the other layer, or an intervening layer may be present. In the following embodiments, a material constituting each layer is merely an example, other materials may be used.

FIG. 1 schematically illustrates a display apparatus 100 according to an embodiment.

Referring to FIG. 1, the display apparatus 100 includes a plurality of pixels. For convenience, only one pixel is illustrated as an example in FIG. 1. The pixel may be a unit for displaying an image. Each of the pixels may include subpixels which emit different colors. An image may be displayed according to an amount of color and light emitted from each of the subpixels. For example, each of the pixels may include a first subpixel SP1, a second subpixel SP2, and a third subpixel SP3.

The display apparatus 100 may include a support substrate 110, a driving layer 130 provided on the support substrate 110, and a light-emitting layer 140 provided on the driving layer 130.

The support substrate 110 may include a substrate which supports the driving layer 130 thereon. The support substrate 110 may not include a growth substrate. According to an embodiment, the support substrate 110 is not a growth substrate. Examples of the support substrate 110 may include a silicon substrate, a glass substrate, a sapphire substrate, and a silicon substrate coated with $SiO_2$. However, this is merely an example, and the support substrate 110 may include other various materials.

The driving layer 130 may include a driving element 135 which electrically drives the light-emitting layer 140. The driving element 135 may include, for example, a transistor, a thin film transistor (TFT), or a high electron mobility transistor (HEMT). The driving layer 130 may further include at least one insulating layer 132.

According to an embodiment, a bonding layer 120 may be provided between the support substrate 110 and the driving layer 130. The bonding layer 120 bonds the driving layer 130 to the support substrate 110 and may include, for example, an adhesive layer or a direct bonding layer. The adhesive layer may include, for example, epoxy, spin on glass (SOG), or benzocyclobutene (BCB). The direct bonding layer may be formed by, for example, plasma or ion beam treatment. The bonding layer 120 physically bonds the driving layer 130 to the support substrate 110. The bonding layer 120 may bond the driving layer 130 to the support substrate 110 by a bonding method which does not require electrical connection.

The light-emitting layer 140 may include a micro light-emitting diode (LED) array. The light-emitting layer 140 may include a first semiconductor layer 142, an active layer 143, and a second semiconductor layer 145, which are sequentially stacked.

The first semiconductor layer 142 may include a first-type semiconductor. For example, the first semiconductor layer 142 may include a p-type semiconductor. The first semiconductor layer 142 may include a group III-V p-type semiconductor, for example, p-GaN. The first semiconductor layer 142 may have a single-layered structure or a multi-layered structure.

The active layer 143 may be provided on the upper surface of the first semiconductor layer 142. The active layer 143 may generate light by combination of electrons and holes. The active layer 143 may have a multi-quantum well (MQW) structure or a single-quantum well (SQW) structure. The active layer 143 may include a group III-V semiconductor, for example, GaN.

The second semiconductor layer 145 may be provided on the upper surface of the active layer 143. The second semiconductor layer 145 may include, for example, an n-type semiconductor. The second semiconductor layer 145 may include a p-type semiconductor. The second semiconductor layer 145 may include a group III-V n-type semiconductor, for example, n-GaN. The second semiconductor layer 145 may have a single-layered structure or a multi-layered structure.

The light-emitting layer 140 may have an isolation structure 147 so that light from the active layer 143 is emitted in subpixel units. In other words, the light-emitting layer 140 may have the isolation structure 147 between adjacent subpixels. The isolation structure 147 may be, for example, an ion implantation region. Ions in the ion implantation region may include, for example, nitrogen (N) ions, boron (B) ions, argon (Ar) ions, or phosphorus (P) ions. Since no current is injected in the ion implantation region, light is not emitted from the ion implantation region. When the isolation structure 147 is configured as the ion implantation region, the light-emitting layer 140 may be formed without a mesa structure. In other words, the isolation structure 147 allows the light-emitting layer 140 to implement a micro light-emitting element array structure without an etching process. Since no etching process is used, a subpixel having a small size may be manufactured and a high-resolution micro light-emitting element array may be manufactured.

A first electrode 141 electrically connected to the first semiconductor layer 142 may be provided, and a second electrode 146 electrically connected to the second semiconductor layer 145 may be provided. The first electrode 141 may include a pixel electrode, and the second electrode 146 may be a common electrode. When the first and second semiconductor layers 142 and 145 include a p-type semiconductor and an n-type semiconductor, respectively, the first and second electrodes 141 and 146 may be a p-type electrode and an n-type electrode, respectively. The driving element 135 is electrically connected to the first electrode 141, and the power on/off to the first electrode 141 may be controlled by the driving element 135. Therefore, the driving element 135 can selectively drive at least one desired subpixel among the plurality of subpixels SP1, SP2, and SP3.

The first electrode 141 may include a reflective material so as to reflect light emitted downward from the active layer 143. The first electrode 141 may include, for example, Ag, Au, Al, Cr, Ni, or an alloy thereof. The second electrode 146 may include a transparent electrode or an opaque electrode. The transparent electrode may include, for example, indium tin oxide (ITO), zinc oxide (ZnO), indium zinc oxide (IZO), or indium gallium zinc oxide (IGZO). When the second electrode 146 is a transparent electrode, the second electrode 146 may be disposed to completely cover the second semiconductor layer 145. When the second electrode 146 is an opaque electrode, the display apparatus 100 may further include a window region 149 so as to transmit light emitted from the active layer 143.

A plurality of color conversion layers 151, 152, and 153 may be provided on the light-emitting layer 140 so as to emit different color lights by the light emitted from the active layer 143. The active layer 143 may emit, for example, blue light. However, the light emitted from the active layer 143 is not limited thereto, and lights having other wavelengths may be used as long as the lights are capable of exciting the color conversion layers 151, 152, and 153. The color conversion layers 151, 152, and 153 may be provided corresponding to the subpixels SP1, SP2, and SP3. The color conversion layers 151, 152, and 153 may include, for example, a blue conversion layer, a green conversion layer, and a red conversion layer. The blue conversion layer 151 may be provided corresponding to the blue subpixel, the green conversion layer 152 may be provided corresponding to the green subpixel, and the red conversion layer 153 may be provided corresponding to the red subpixel.

The blue conversion layer 151 may be a transmissive layer that includes a material for emitting blue light or transmits blue light emitted from the active layer 143.

When the blue light is emitted from the active layer 143, the blue conversion layer 151 may transmit light emitted from the active layer 143 and emit the light to the outside.

The blue conversion layer 151 may further include a light scattering agent or a photoresist having excellent transmission characteristics.

The green conversion layer 152 may convert light emitted from the active layer 143 into green light and then emit the green light. The green conversion layer 152 may include, for example, quantum dots (QDs) that have a predetermined size and are excited by blue light to emit green light. The QD may have a core-shell structure having a core portion and a shell portion, and may also have a particle structure having no shell. The core-shell structure may have a single-shell or a multi-shell. The multi-shell may be, for example, a double-shell.

The QD may include, for example, at least one selected from a group II-VI semiconductor, a group III-V semiconductor, a group IV-VI semiconductor, a group IV semiconductor, and a graphene quantum dot. As a specific example, the QD may include at least one selected from Cd, Se, Zn, S, and InP, but is not limited thereto. Each of the QDs may have a diameter of several tens nm or less, for example, a diameter of about 10 nm or less. In addition, the green conversion layer 152 may include phosphor that is excited by the light emitted from the active layer 143 to emit green light. On the other hand, the green conversion layer 152 may further include a photoresist having excellent transmission characteristics or a light scattering agent that uniformly emits green light.

The red conversion layer 153 may convert blue light emitted from the active layer 143 into red light and then emit the red light. The red conversion layer 153 may include QDs that have a predetermined size and are excited by blue light to emit red light. In addition, the red conversion layer 153 may include phosphor that is excited by blue light B emitted from the active layer 143 to emit red light. On the other hand, the red conversion layer 153 may further include a photoresist or a light scattering agent.

A partition wall 150 may be provided between the blue conversion layer 151, the green conversion layer 152, and the red conversion layer 153. A reflective film 155 may be further provided on the side surface of the partition wall 150 to improve the efficiency of light converted and emitted by each color conversion layer. Alternatively, the partition wall 150 may include a black matrix that absorbs light. The black matrix may prevent crosstalk between the blue conversion layer 151, the green conversion layer 152, and the red conversion layer 153, thereby improving the contrast.

In such a structure, for example, when the driving element 135 corresponding to the blue subpixel SP1 is driven and a predetermined voltage is applied between the first electrode 141 corresponding to the blue subpixel SP1 and the second electrode 146 serving as the common electrode, blue light is emitted from the active layer 143 positioned below the blue conversion layer 151. When the blue light is incident on the blue conversion layer 151, the blue conversion layer 151 emits blue light to the outside. In addition, for example, when the driving element 135 corresponding to the green subpixel SP2 is driven and a predetermined voltage is applied between the first electrode 141 corresponding to the green subpixel SP2 and the second electrode 146, blue light is emitted from the active layer 143 positioned below the green conversion layer 152. When the blue light is incident on the green conversion layer 152, the green conversion layer 152 emits green light to the outside.

In addition, for example, when the driving element 135 corresponding to the red subpixel SP3 is driven and a predetermined voltage is applied between the first electrode 141 corresponding to the red subpixel SP3 and the second electrode 146, blue light is emitted from the active layer 143 positioned below the red conversion layer 153. The blue light passes through the red conversion layer 153 and is emitted to the outside.

According to the embodiment, a high-resolution display apparatus with improved light efficiency may be realized. In order to implement a display apparatus, it has been necessary to form a driving layer and a light-emitting layer, respectively, and bond the driving layer and the light-emitting layer. In this case, it is not easy to electrically connect the driving layer to the light-emitting layer. In addition, if the size of the subpixel is reduced so as to increase the resolution, an alignment error rate of the driving layer and the light-emitting layer may be increased. In contrast, in one or more embodiments of the disclosure, since the driving layer and the light-emitting layer are monolithically manufactured, the electrical connection characteristics between the driving layer and the light-emitting layer are excellent, and the isolation structure of the light-emitting layer reduces the size of the subpixel, thereby improving the resolution.

Since the display apparatus according to the embodiment includes the isolation structure 147 between the adjacent subpixels, the current injected from the first electrode may be prevented from spreading to the adjacent subpixels. In addition, since there is no mesa etching process for separating the subpixels, the internal quantum efficiency of the display apparatus may be improved. In addition, since the driving layer 130 is disposed below the light-emitting layer 140, the light-emitting area may increase, and thus, the luminous efficiency may be improved.

Figure 2:
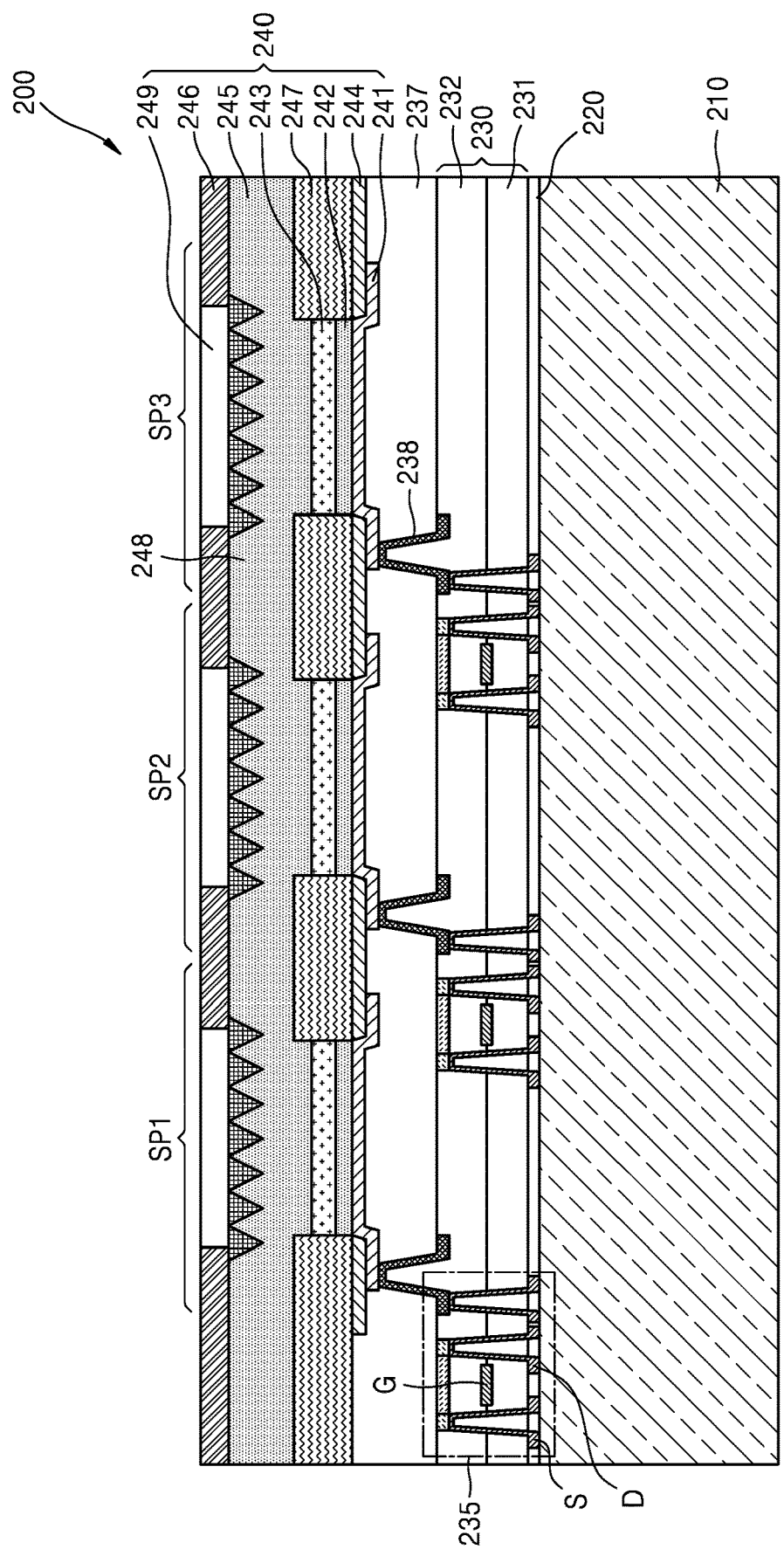
FIG. 2 illustrates a display apparatus according to another embodiment.

FIG. 2 illustrates a display apparatus 200 according to another embodiment.

The display apparatus 200 may include a first subpixel SP1, a second subpixel SP2, and a third subpixel SP3. The first subpixel SP1, the second subpixel SP2, and the third subpixel SP3 may emit different color lights, respectively. The display apparatus 200 may include a support substrate 210, a driving layer 230 provided on the support substrate 210, and a light-emitting layer 240 provided on the driving layer 230.

The support substrate 210 may not include a growth substrate, but may include a substrate which supports the driving layer 230. Examples of the substrate 210 may include a silicon substrate, a glass substrate, a sapphire substrate, and a silicon substrate coated with $SiO_2$. However, this is merely an example, and the substrate 210 may include other various materials.

The driving layer 230 may include a driving element 235 which electrically drives a light-emitting layer 220 for each subpixel. The driving element 235 may include, for example, a transistor, a TFT, or an HEMT. For example, the driving element 235 may include a gate electrode G, a source electrode S, and a drain electrode D. The driving layer 230 may further include at least one insulating layer. For example, the at least one insulating layer may include a first insulating layer 231 and a second insulating layer 232. The second insulating layer 231 may be, for example, a gate oxide. A third insulating layer 237 may be further provided between the driving layer 230 and the light-emitting layer 240.

A bonding layer 220 may be provided between the support substrate 210 and the driving layer 230. The bonding layer 220 bonds the driving layer 230 to the support substrate 210 and may include, for example, an adhesive layer or a direct bonding layer. The bonding layer 220 physically bonds the driving layer 230 to the support substrate 210. The bonding layer 220 may bond the driving layer 230 to the support substrate 210 by a bonding method which does not require electrical connection. For example, the bonding layer 220 may cover the source electrode S and the drain electrode D in the bonding process.

The light-emitting layer 240 may include a micro light-emitting element array, for example, a micro LED array. The light-emitting layer 240 may include a first semiconductor layer 242, an active layer 243, and a second semiconductor layer 245, which are sequentially stacked.

The first semiconductor layer 242 may include a first-type semiconductor. For example, the first semiconductor layer 242 may include a p-type semiconductor. The first semiconductor layer 242 may include a group III-V p-type semiconductor, for example, p-GaN. The first semiconductor layer 242 may have a single-layered structure or a multi-layered structure.

The active layer 243 may be provided on the upper surface of the first semiconductor layer 241. The active layer 243 may generate light by combination of electrons and holes. The active layer 243 may have an MQW structure or an SQW structure. The active layer 243 may include a group III-V semiconductor, for example, GaN. The active layer 243 may include a two-dimensional thin film structure, or may include a three-dimensional structure such as a rod or pyramid structure.

The second semiconductor layer 245 may be provided on the upper surface of the active layer 243. The second semiconductor layer 245 may include, for example, an n-type semiconductor. The second semiconductor layer 245 may include a group III-V n-type semiconductor, for example, n-GaN. The second semiconductor layer 245 may have a single-layered structure or a multi-layered structure.

The light-emitting layer 240 may include, for example, inorganic-based micro LEDs. The micro LEDs may be provided for each subpixel. The light-emitting layer 240 may have an isolation structure 247 so that light from the active layer 243 is emitted in subpixel units. In other words, the light-emitting layer 240 may have the isolation structure 247 between adjacent subpixels. The micro-LED structures may be apart by the isolation structure 247. The isolation structure 247 may be, for example, an ion implantation region. Since no current is injected into the ion implantation region, no light is emitted. The ion implantation region is formed by implantation of ions such as nitrogen ions or boron ions, and may have insulating properties. In the ion implantation region, for example, the ions may be implanted at a dose of approximately $10^{12}$ ions/cm$^2$ to $10^{20}$ ions/cm$^2$. However, this is merely an example, and the present disclosure is not limited thereto.

A first electrode 241 electrically connected to the first semiconductor layer 242 may be provided, and a second electrode 246 electrically connected to the second semiconductor layer 245 may be provided. The first electrode 241 may include a pixel electrode, and the second electrode 246 may be a common electrode. When the first and second semiconductor layers 242 and 245 include a p-type semiconductor and an n-type semiconductor, respectively, the first and second electrodes 241 and 246 may be a p-type electrode and an n-type electrode, respectively. The driving element 235 is electrically connected to the first electrode 241, and the power on/off to the first electrode 241 may be controlled by the driving element 235. Therefore, the driving element 235 can selectively drive at least one desired subpixel among the plurality of subpixels SP1, SP2, and SP3.

The first electrode 241 may include a reflective material so as to reflect light emitted downward from the active layer 243. The first electrode 241 may include, for example, Ag, Au, Al, Cr, Ni, or an alloy thereof. The first electrode 241 may include a pixel electrode and may independently drive the subpixel. The first electrodes 241 may be apart from each other and may be disposed to face the active layer 243. Current blocking layers 244 may be further provided on both sides of the first electrode 241. The current blocking layer 244 may prevent current from leaking to another adjacent subpixel region. The current blocking layer 244 may include, for example, silicon oxide or silicon nitride. The current blocking layer 244 may be provided between the lower surface of the isolation structure 247 and the first electrode 241. The current blocking layer 244 may be disposed corresponding to the lower portion of the isolation structure 247.

An insulating layer 237 may be further provided between the driving layer 230 and the light-emitting layer 240. A via hole 238 may be further provided in the insulating layer 237 so that the driving element 235 and the first electrode 241 are electrically connected to each other.

The second electrode 246 may include a transparent electrode or an opaque electrode. The transparent electrode may include, for example, ITO, ZnO, IZO, or IGZO. When the second electrode 246 includes a transparent electrode, the second electrode 246 may be disposed to completely cover the second semiconductor layer 245. This will be described below. When the second electrode 246 includes an opaque electrode, the display apparatus 200 may further include a window region 249 so as to transmit light emitted from the active layer 243. The window region 249 may be provided at a position corresponding to the active layer 243.

The second semiconductor layer 245 may include a fine pattern structure 248. The fine pattern structure 248 may increase extraction efficiency. The fine pattern structure 248 may be provided in a region corresponding to the active layer 243.

The isolation structure 247 may have a predetermined thickness from the first semiconductor layer 242. The isolation structure 247 may have a thickness sufficient to prevent current from being injected into the first semiconductor layer 242 by the first electrode 241. Since the current injected from the first electrode 241 to the first semiconductor layer 242 needs to be controlled in subpixel units and the current may be injected into the second semiconductor layer 245 as a whole, the isolation structure 247 may not completely reach the upper surface of the second semiconductor layer 245. For example, the isolation structure 247 may have a thickness equal to or greater than the sum of the thicknesses of the first semiconductor layer 242 and the active layer 243. Alternatively, the isolation structure 247 may have a thickness that isolates from the first semiconductor layer 242 to the second semiconductor layer 245.

In the embodiment, light directed downward among the lights emitted from the active layer 243 may be reflected by the first electrode 241 and directed upward. Since the isolation structure 247 has no mesa structure, light directed laterally from the active layer 243 may be directed upward without being absorbed or scattered. Therefore, luminous efficiency may be improved. In addition, since the size of the subpixel may be reduced by the isolation structure 247, resolution may be increased. In addition, since the fine pattern structure 248 is provided in the second semiconductor layer 245, external quantum efficiency may be increased. In addition, the present embodiment may have a vertical electrode structure in which the first electrode 241 and the second electrode 246 are vertically disposed with respect to the active layer 243. Since the second electrode 246 is disposed below the active layer 243, the second electrode 246 may be formed without a via hole process. Therefore, the electrode may be formed without a mesa structure.

Figure 3:
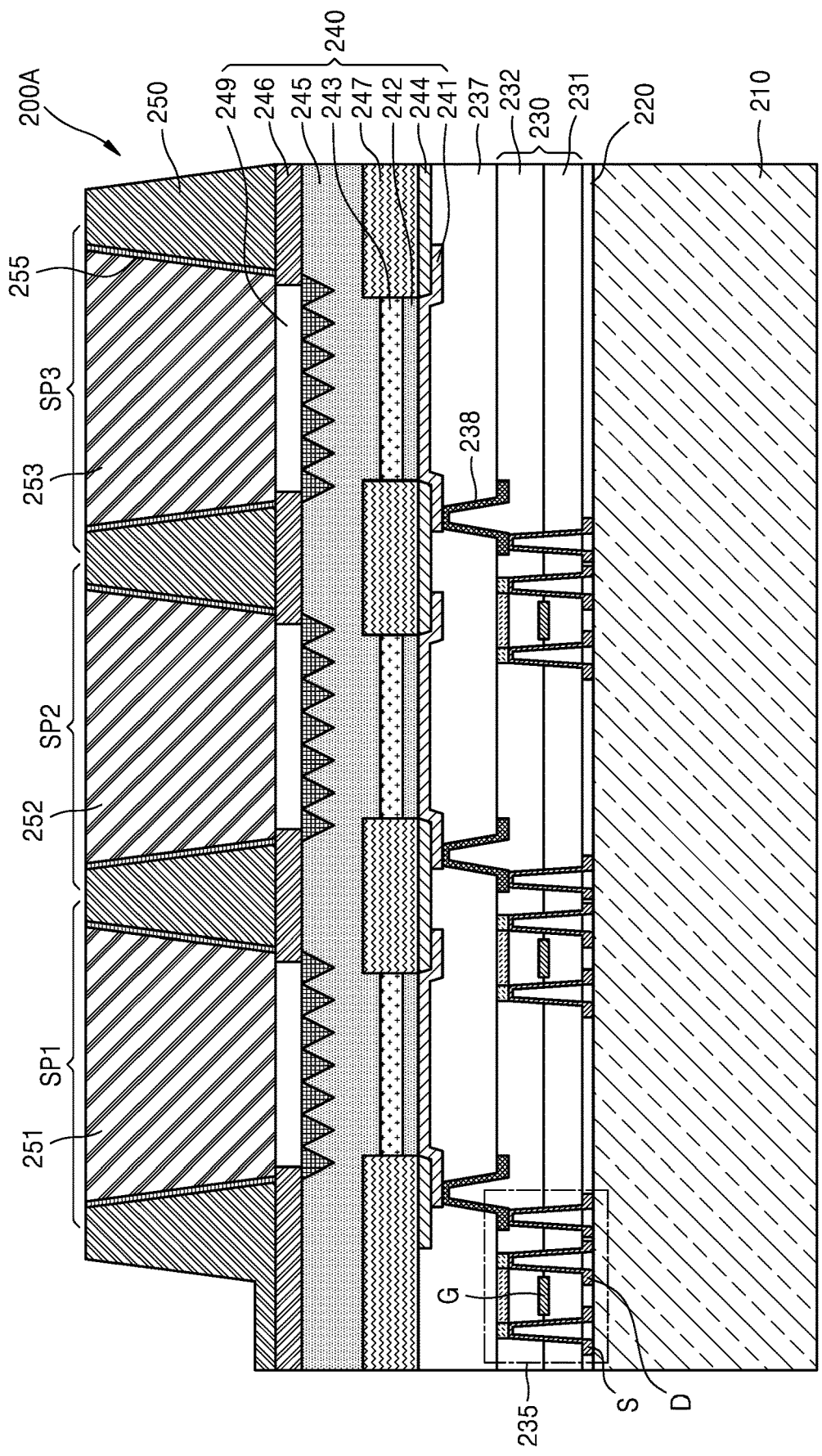
FIG. 3 illustrates a structure in which a color conversion layer is further provided in the display apparatus illustrated in FIG. 2.

FIG. 3 illustrates a display apparatus 200A having a color conversion layer in the structure illustrated in FIG. 2. In FIG. 3, components, to which the same reference numerals as those of FIG. 2 are assigned, have substantially the same functions and configurations as those described with reference to FIG. 2, and detailed descriptions thereof will be omitted herein.

The display apparatus 200A may include a support substrate 210, a driving layer 230, a light-emitting layer 240, and a plurality of color conversion layers 251, 252, and 253.

The plurality of color conversion layers 251, 252, and 253 may be provided on the light-emitting layer 240 so as to emit different color lights by light emitted from an active layer 243 of the light-emitting layer 240. The active layer 243 may emit, for example, blue light. However, this is merely an example, and it is also possible to emit lights having different wavelengths capable of exciting the color conversion layers 251, 252, and 253. The color conversion layers 251, 252, and 253 may be provided corresponding to respective subpixels SP1, SP2, and SP3. The color conversion layers 251, 252, and 253 may include, for example, a blue conversion layer 251, a green conversion layer 252, and a red conversion layer 253. The blue conversion layer 251 may correspond to the blue subpixel, the green conversion layer 252 may correspond to the green subpixel, and the red conversion layer 253 may correspond to the red subpixel.

The blue conversion layer 251 may include, for example, a transmissive layer that includes a material for emitting blue light or transmits blue light emitted from the active layer 243.

The blue conversion layer 251 may transmit blue light emitted from the active layer 243 and emit the blue light to the outside. The blue conversion layer 251 may further include a light scattering agent or a photoresist having excellent transmission characteristics.

The green conversion layer 252 may emit green light by blue light emitted from the active layer 243. The green conversion layer 252 may include QDs that have a predetermined size and are excited by blue light to emit green light. The QD may have a core-shell structure having a core portion and a shell portion, and may also have a particle structure having no shell. The core-shell structure may have a single-shell or a multi-shell. The multi-shell may be, for example, a double-shell.

The QD may include, for example, at least one selected from a group II-VI semiconductor, a group III-V semiconductor, a group IV-VI semiconductor, a group IV semiconductor, and a graphene quantum dot. As a specific example, the QD may include at least one selected from Cd, Se, Zn, S, and InP, but the QD is not limited thereto. Each of the QDs may have a diameter of several tens nm or less, for example, a diameter of about 10 nm or less. In addition, the green conversion layer 252 may include a phosphor that is excited by the blue light emitted from the active layer 243 to emit green light. On the other hand, the green conversion layer 252 may further include a photoresist having excellent transmission characteristics or a light scattering agent that uniformly emits green light.

The red conversion layer 253 may convert blue light emitted from the active layer 243 into red light and then emit the red light. The red conversion layer 253 may include QDs that have a predetermined size and are excited by blue light to emit red light. In addition, the red conversion layer 253 may include a phosphor that is excited by blue light emitted from the active layer 243 to emit red light. On the other hand, the red conversion layer 253 may further include a photoresist or a light scattering agent.

The color conversion layers 251, 252, and 253 may have a cross-sectional shape that increases in width toward the above. Partition walls 250 may be provided between the adjacent color conversion layers 251, 252, and 253. A reflective film 255 may be further provided on the side surface of the partition wall 250 to improve the efficiency of light converted and emitted by each color conversion layer. Alternatively, the partition wall 250 may include a black matrix that absorbs light. The black matrix may prevent crosstalk between the blue conversion layer 251, the green conversion layer 252, and the red conversion layer 253, thereby improving contrast.

For example, blue light is emitted from each subpixel of the light-emitting layer 240, and corresponding color light may be emitted from the color conversion layer of each subpixel by blue light. The amount of light may be controlled by the amount of current injected into the first electrode 241 and the second electrode 246, and color light is emitted by the color conversion layer in each subpixel. In this manner, a color image may be displayed. Even if the size of the subpixel is reduced, the isolation structure 247 reduces or prevents light from leaking out to the adjacent subpixels, thereby increasing the resolution of the display apparatus 200A.

Figure 4:
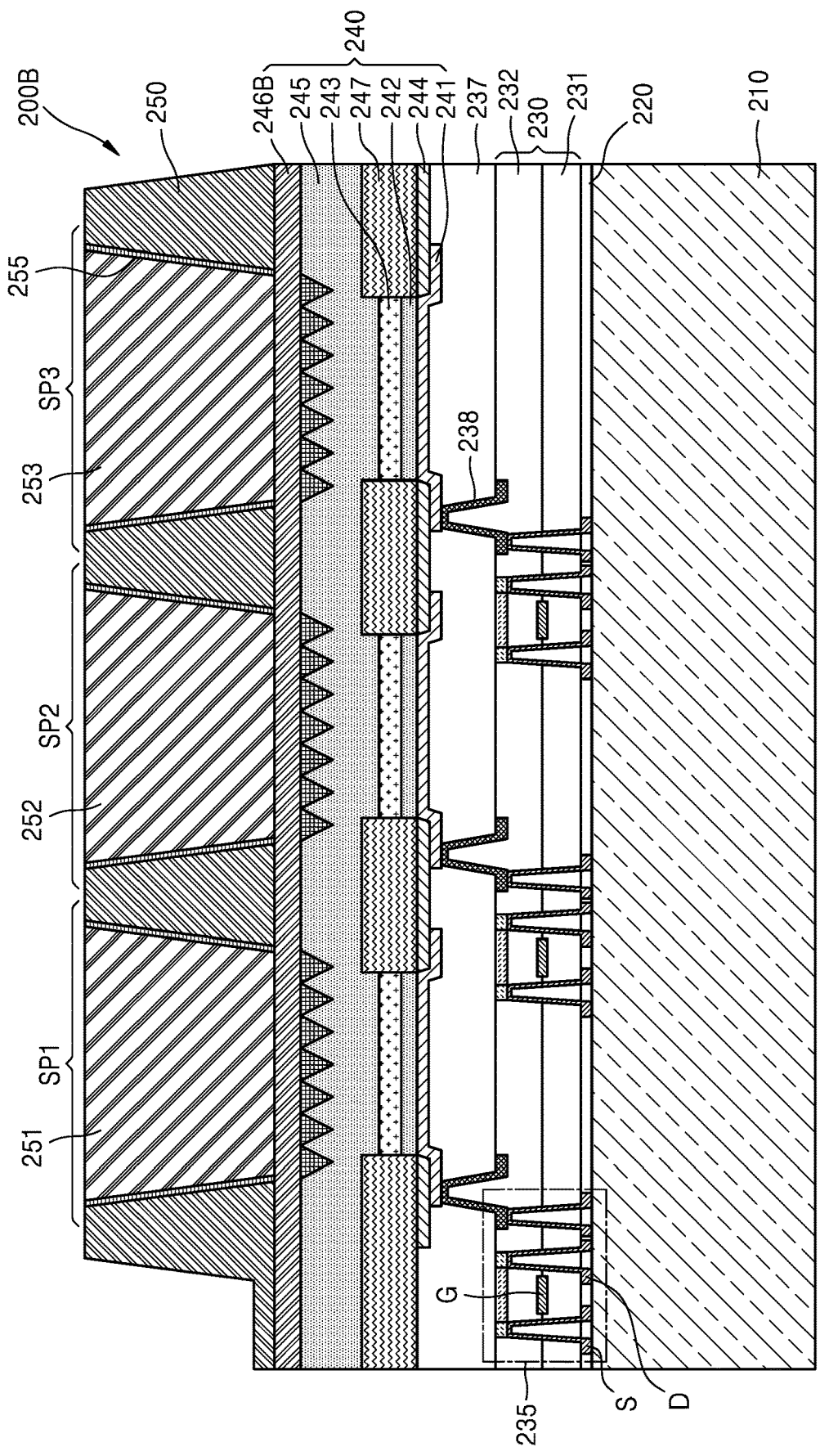
FIG. 4 illustrates an example in which an electrode structure is modified in the display apparatus illustrated in FIG. 3 according to an embodiment.

FIG. 4 illustrates an example in which a structure of a second electrode is changed as compared with FIG. 3.

Referring to FIG. 4, in a display apparatus 200B, a second electrode 246B may include a transparent electrode. The second electrode 246B may include, for example, ITO, ZnO, IZO, or IGZO. The second electrode 246B may be a common electrode formed in one plate shape. The second electrode 246B may be disposed to completely cover the second semiconductor layer 245. When the second electrode 246B is provided as a transparent electrode, a window region for allowing light to pass therethrough is not needed, and a manufacturing process may be simplified.

Figure 5:
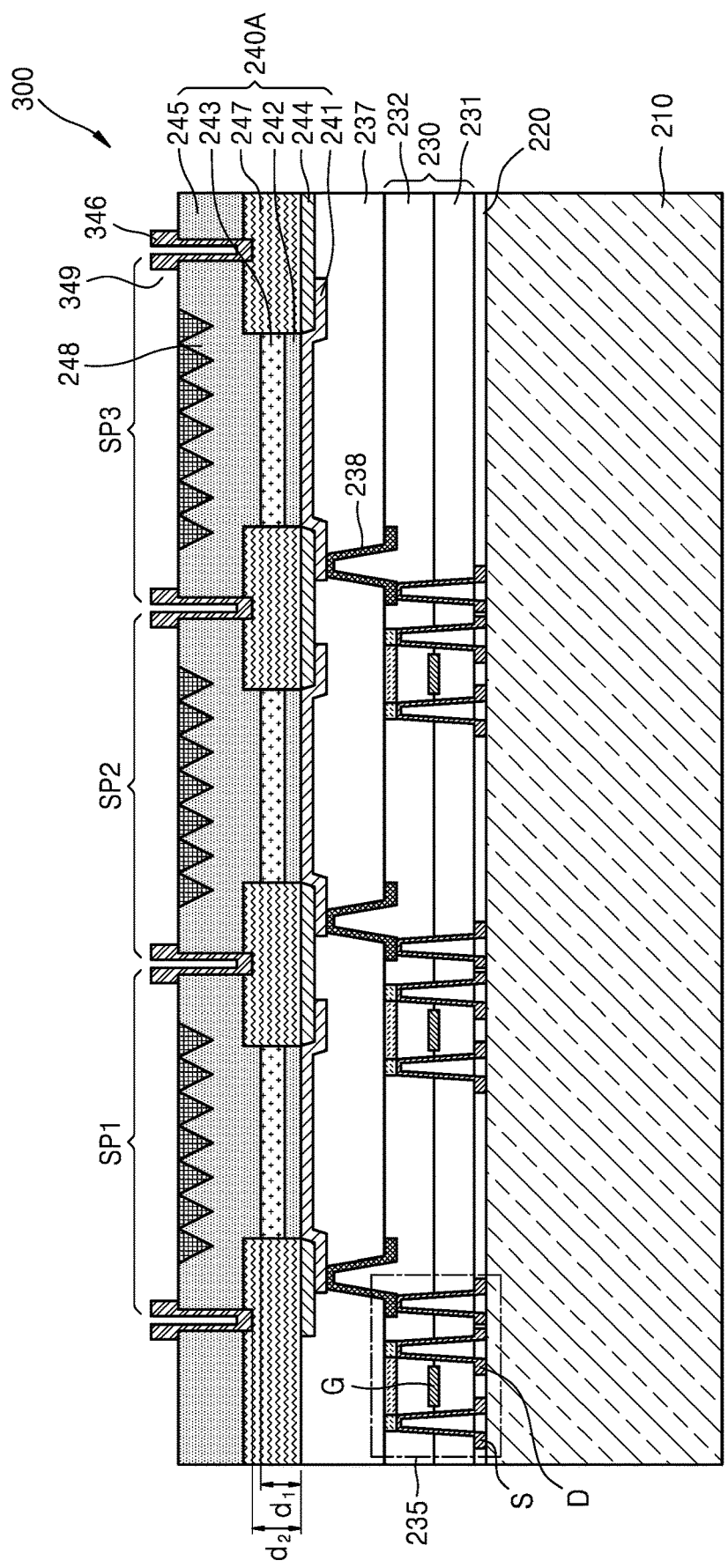
FIG. 5 illustrates a display apparatus according to another embodiment.

FIG. 5 illustrates a display apparatus 300 according to another embodiment.

Referring to FIG. 5, the display apparatus 300 may include a support substrate 210, a driving layer 230, and a light-emitting layer 240A. In FIG. 5, components, to which the same reference numerals as those of FIG. 2 are assigned, have substantially the same functions and configurations as those described with reference to FIG. 2, and detailed descriptions thereof will be omitted herein A second electrode 346 may be provided on a second semiconductor layer 245 of the light-emitting layer 240A. The second electrode 346 may include a trench structure positioned between adjacent subpixels of the second semiconductor layer 245. A window region 349 may be provided in a region in which light is emitted in the subpixel region. The second electrode 346 may be formed in a trench structure extending to an isolation structure 247. The second electrode 346 is a common electrode and may be connected as a single body in a region except for the window region 349. The second electrode 346 may include a conductive material. Alternatively, the second electrode 346 may include a conductive material having reflective characteristics. The second electrode 346 may include, for example, Ag, Au, Al, Cr, Ni, or an alloy thereof.

When the second electrode 346 includes a conductive material having reflective characteristics, the light directed laterally from the active layer 243 may be reflected and emitted to the window region 349 of the corresponding subpixel. That is, the second electrode 346 may be disposed to be vertically elongated in a trench structure and serve as a lateral reflective film.

When a thickness from the bottom surface of the isolation structure 247 to the upper surface of the active layer 243 is d1 and a thickness from the bottom surface of the isolation structure 247 to the bottom surface of the trench structure of the second electrode 346 is d2, the second electrode 346 may include a trench structure that satisfies d1<d2. The bottom surface of the isolation structure 247 may be a surface facing the support substrate 210, and the upper surface of the active layer 243 may be a surface away from the support substrate 210. That is, the trench structure of the second electrode 346 may have the bottom surface disposed above the extension of the surface of the active layer 243 that faces the second semiconductor layer 245.

Since the second electrode 346 injects a current into the second semiconductor layer 245, the second electrode 346 may have a thickness within a range not departing from the second semiconductor layer 245. When the second electrode 346 has a trench structure, the active layer 243 is not exposed by preventing the trench structure from reaching the active layer 243, thereby preventing deterioration in internal quantum efficiency of light. As such, when the second electrode 346 has a trench structure, the contact area with the second semiconductor layer 245 is wide. Hence, current injection efficiency may be increased, and the second electrode 346 may serve as a lateral reflective film of light from the active layer 243. Therefore, the internal quantum efficiency and the extraction efficiency may be improved by the trench structure of the second semiconductor layer 245, and the external quantum efficiency may be improved. In addition, since the driving layer 230 is disposed below the light-emitting layer 240A and the second electrode 346 is disposed above the light-emitting layer 240A, the structure of the second electrode 346 may be freely changed and a region in which light is emitted may be ensured relatively widely.

Various embodiments may have a vertical electrode structure in which the first electrode 241 and the second electrode 346 are vertically disposed with respect to the active layer 243.

Figure 6:
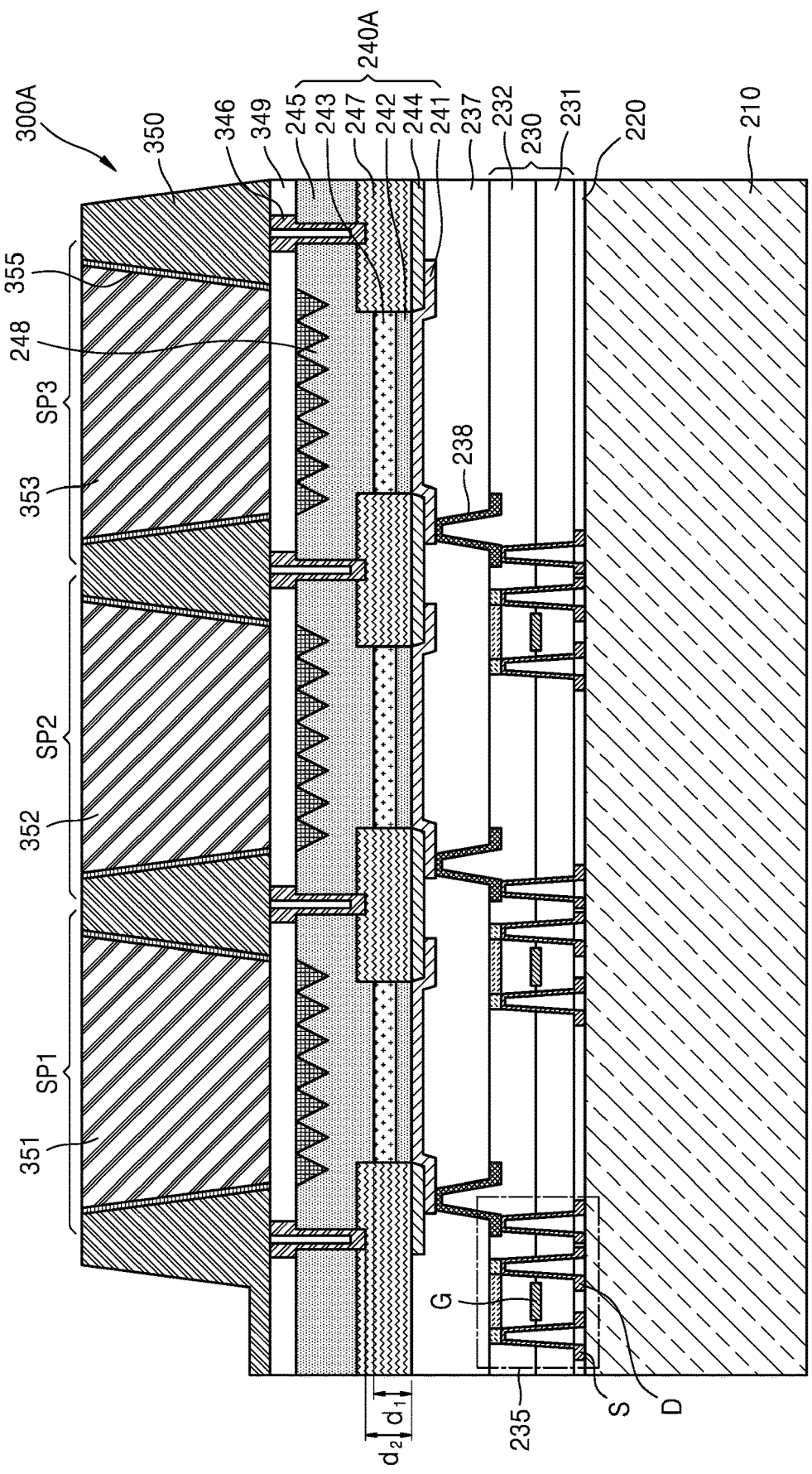
FIG. 6 illustrates a structure in which a color conversion layer is further provided in the display apparatus illustrated in FIG. 5.

FIG. 6 illustrates a display apparatus 300A having a color conversion layer in the structure illustrated in FIG. 5. In FIG. 6, components, to which the same reference numerals as those of FIGS. 2 and 5 are assigned, have substantially the same functions and configurations as those described with reference to FIGS. 2 and 5, and detailed descriptions thereof will be omitted herein.

The display apparatus 300A may include a support substrate 210, a driving layer 230, an inorganic-based light-emitting layer 240A, and a plurality of color conversion layers 351, 532, and 353.

The plurality of color conversion layers 351, 352, and 353 may be provided on the inorganic-based light-emitting layer 240A so as to emit different color lights by light emitted from an active layer 243 of the inorganic-based light-emitting layer 240A. The active layer 243 may emit, for example, blue light. The color conversion layers 351, 352, and 353 may be provided respectively corresponding to subpixels SP1, SP2, and SP3. The color conversion layers 351, 352, and 353 may include, for example, a blue conversion layer 351, a green conversion layer 352, and a red conversion layer 353. The blue conversion layer 351 may correspond to the blue subpixel, the green conversion layer 352 may correspond to the green subpixel, and the red conversion layer 353 may correspond to the red subpixel.

Protective layers 349 may be further provided between the second semiconductor layer 245 and the color conversion layers 351, 352, and 353. Partition walls 350 may be provided between the color conversion layers 351, 352, and 353. A reflective film 355 may be provided on the side surface of the partition wall 350 to improve the extraction efficiency of light converted and emitted by each color conversion layer. Alternatively, the partition wall 350 may include a black matrix that absorbs light.

For example, blue light is emitted from each subpixel of the inorganic-based light-emitting layer 240A, and corresponding color light may be emitted from the color conversion layer of each subpixel by blue light. The amount of light may be controlled by the amount of current injected into the first electrode 241 and the second electrode 346, and color light is emitted by the color conversion layer in each subpixel. In this manner, a color image may be displayed. Since the size of the subpixel is reduced, the resolution of the display apparatus may be increased. Even if the size of the subpixel is reduced, the isolation structure reduces or prevents light from leaking out to the adjacent subpixels, and the trench structure of the second electrode 346 reflects lateral light, thereby increasing the efficiency of outgoing light.

In the display apparatuses according to various embodiments, since the isolation structure 247 having an ion implantation region is formed perpendicular to the light-emitting layer, the current injected from the electrode may be prevented from spreading to the subpixels of the adjacent regions. Since there is no mesa etching process for separating the subpixel regions, there is no current concentration at an etched edge, and the luminous efficiency of the manufactured display apparatus may be improved.

The display apparatuses according to various embodiments may be applied to, for example, a head up display or a virtual reality (VR) glass, an augmented reality (AR) glass, or the like. In addition, the display apparatuses according to embodiments may be applied to various products.

Next, a method of manufacturing a display apparatus, according to an embodiment, will be described.

Figure 7:
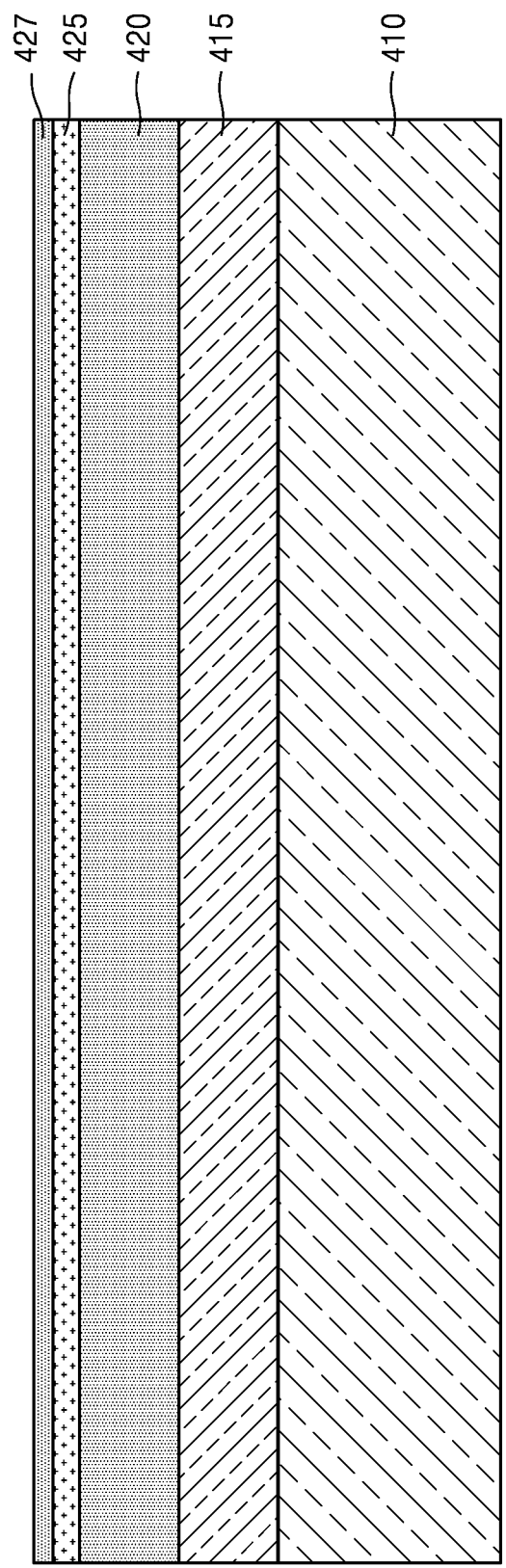
FIGS. 7 to 16 illustrate a method of manufacturing a display apparatus, according to an embodiment.

Referring to FIG. 7, a first semiconductor layer 420, a first layer 425, and a second semiconductor layer 427 may be grown on an epitaxial substrate 410. The epitaxial substrate 410 may include, for example, a silicon substrate or a sapphire substrate. However, one or more embodiments of the disclosure are not limited thereto, and various epitaxial substrates may be used. The first semiconductor layer 420 may include an n-type semiconductor layer. However, in some cases, the first semiconductor layer 420 may include a p-type semiconductor layer. For example, the first semiconductor layer 420 may include n-type GaN. The first layer 425 may include a layer in which an active layer is to be formed, and may include, for example, GaN. A buffer layer 415 may be further formed between the epitaxial substrate 410 and the first semiconductor layer 420. The buffer layer 415 may include a single-layered structure or a multi-layered structure and may help the first semiconductor layer 420 grow well. The buffer layer 415 may include, for example, AlN. An undoped semiconductor layer (not illustrated), for example, u-GaN, may be further formed between the buffer layer 415 and the first semiconductor layer 420.

Figure 8:
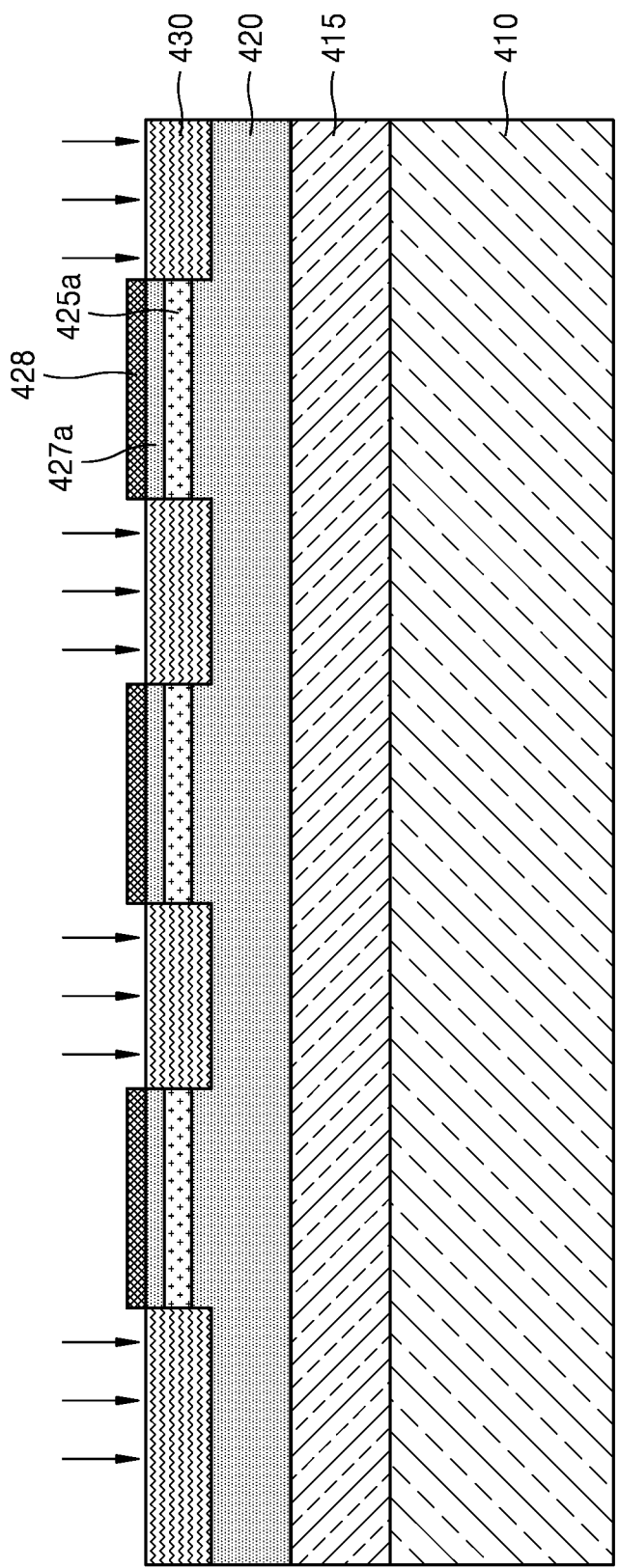

Referring to FIGS. 7 and 8, an isolation structure 430 may be formed in the first layer 425 and the second semiconductor layer 427 by using a mask 428. The mask 428 may be, for example, an ion implantation mask. For example, the isolation structure 430 may be formed by implanting ions into a predetermined region of the first layer 425 and the second semiconductor layer 427. The ions may include, for example, nitrogen (N) ions, boron (B) ions, argon (Ar) ions, or phosphorus (P) ions. However, the ions are not limited thereto. Although an example in which the isolation structure 430 is formed in the first layer 425 and the second semiconductor layer 427 is illustrated in FIG. 8, the thickness of the isolation structure 430 may be variously determined. For example, the isolation structure 430 may be formed from the second semiconductor layer 427 to a partial depth of the first semiconductor layer 420. An active layer 425*a* and a second semiconductor layer 427*a*, which are apart from each other, may be formed by the isolation structure 430. The active layer 425*a* and the second semiconductor layer 427*a*, which are apart from each other, may define a subpixel region. A micro light emitting structure array, for example, a micro LED array, may be formed by the isolation structure 430.

When the subpixels are electrically separated by the ion implantation region as described above, the edge portion of the active layer 425*a* at which defects may exist is deactivated through ion implantation, thereby inducing light emission only in the active layer 425*a*. In addition, since the subpixels are electrically separated by the ion implantation region, it is possible to prevent the local contrast from being reduced. The reduction in the local contrast may be caused by the emission of light to unintended adjacent subpixels) at a subpixel interface having a horizontal mesa-free structure at which no structural separation between subpixels occurs. However, in the present embodiment, it is possible to prevent current spreading to adjacent subpixels by the mesa-free isolation structure, thereby improving contrast.

According to an embodiment, pixels may also be electrically separated by the ion implantation region, and the edge portion of the active layer 425*a* at which defects may exist is deactivated through ion implantation, thereby inducing light emission only in the active layer 425*a*. In addition, since the pixels are electrically separated by the ion implantation region, it is possible to prevent the local contrast from being reduced. The reduction in the local contrast may be caused by the emission of light to unintended adjacent pixels at a pixel interface having a horizontal mesa-free structure at which no structural separation between pixels occurs. However, in the present embodiment, it is possible to prevent current spreading to adjacent pixels by the mesa-free isolation structure, thereby improving contrast.

Figure 9:
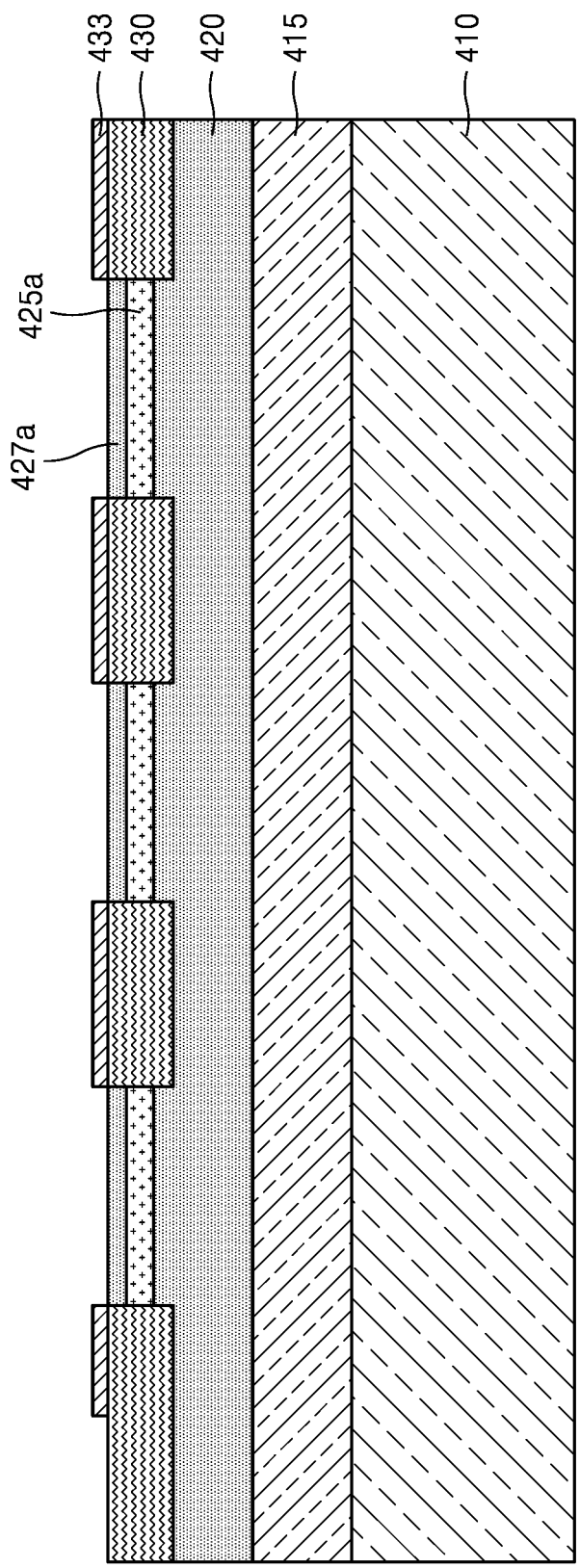

Referring to FIG. 9, a current blocking layer 433 may be deposited on the isolation structure 430. The current blocking layer 433 may be formed through a photoresist and an etching process. The current blocking layer 433 may include an insulating material. The current blocking layer 433 may electrically insulate first electrodes to be formed later. The current blocking layer 433 may be omitted.

Figure 10:
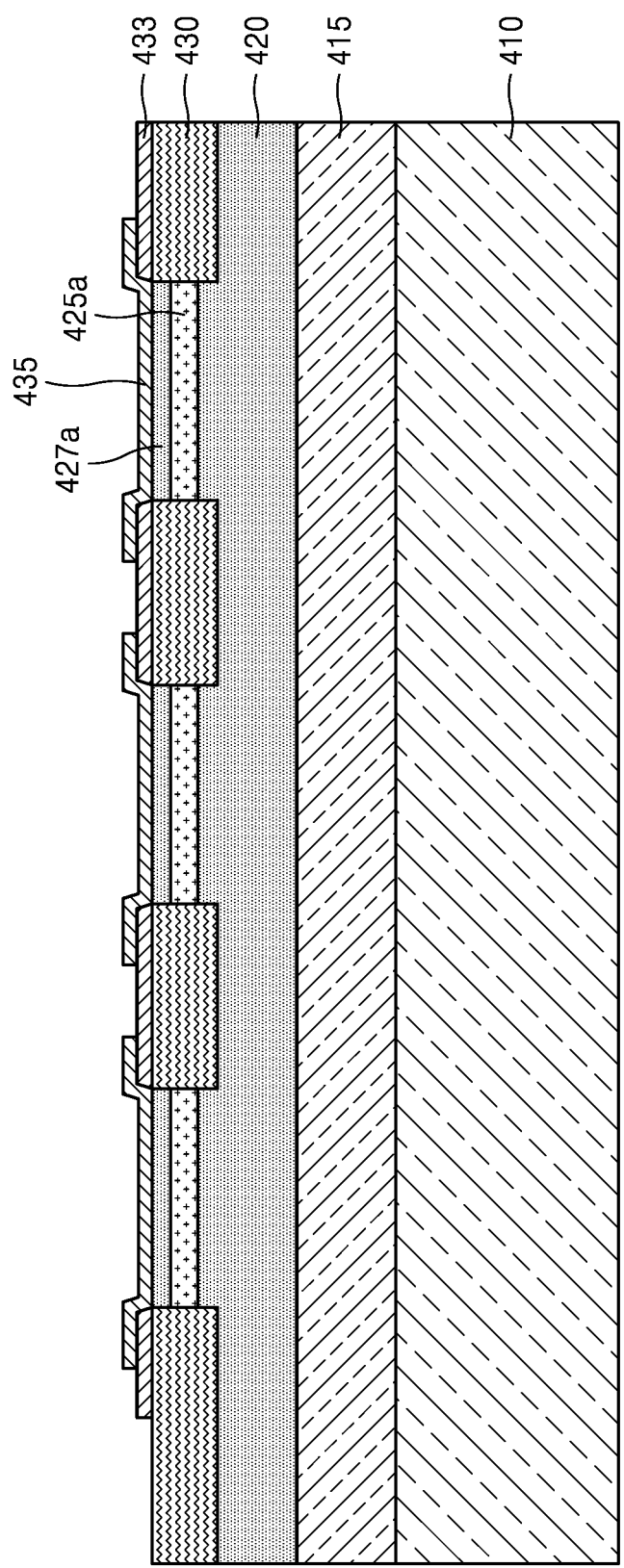

Referring to FIG. 10, a conductive material may be deposited on the structure illustrated in FIG. 9, and second electrodes 435 apart in subpixel units may be formed through etching. The second electrode 435 may include a pixel electrode that operates in subpixel units. The second electrode 435 may include a conductive material having reflective characteristics. The second electrode 435 may include, for example, Ag, Au, Al, Cr, Ni, or an alloy thereof. The second electrode 435 may be an opaque electrode.

Figure 11:
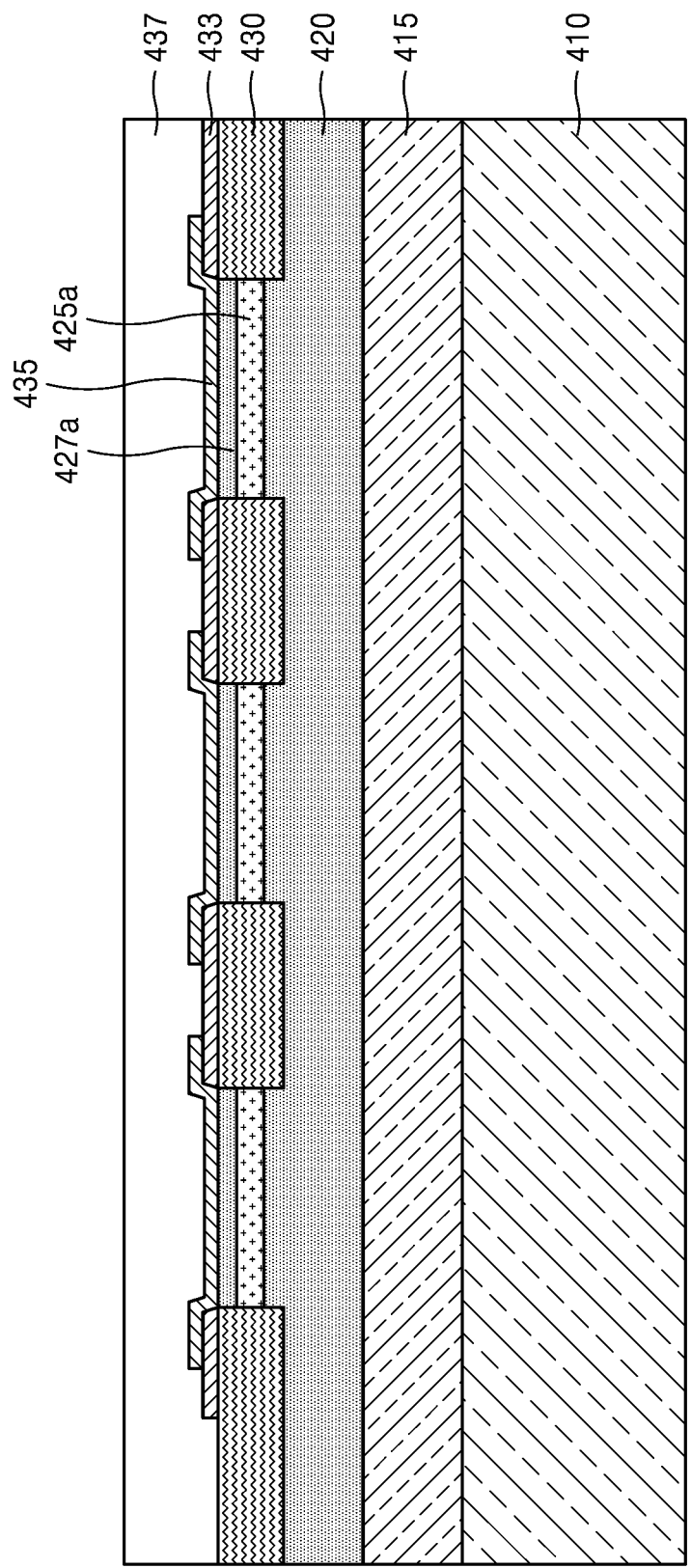

Referring to FIG. 11, a first insulating layer 437 may be formed to cover the second electrode 435. The first insulating layer 437 may include, for example, $SiO_2$, SiN, $Al_2O_3$, or $TiO_2$, but one or more embodiments of the present disclosure are not limited thereto.

Figure 12:
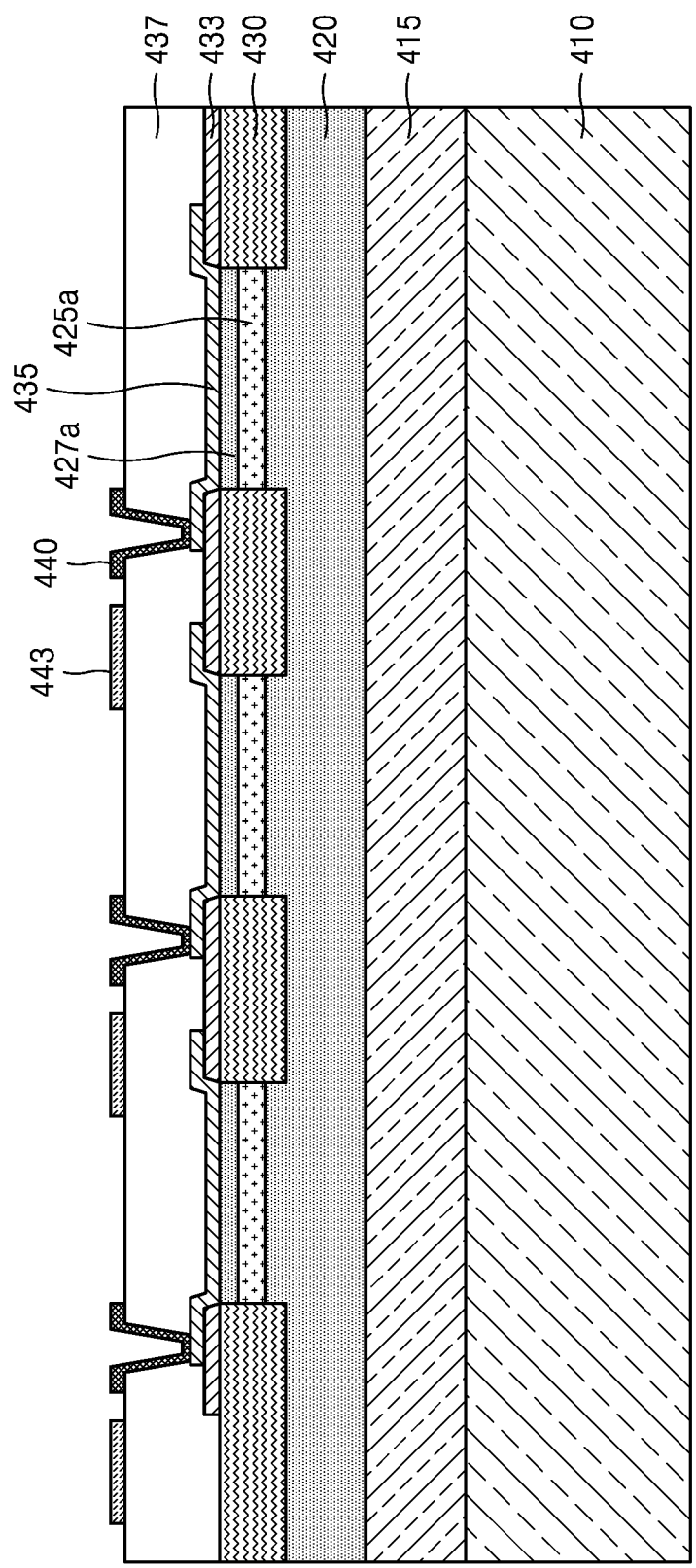

Referring to FIG. 12, a via hole 440 and an electrode pad 443 may be formed by etching the first insulating layer 437 and depositing a conductive material thereon. The via hole 440 may reach the first electrode 435.

Figure 13:
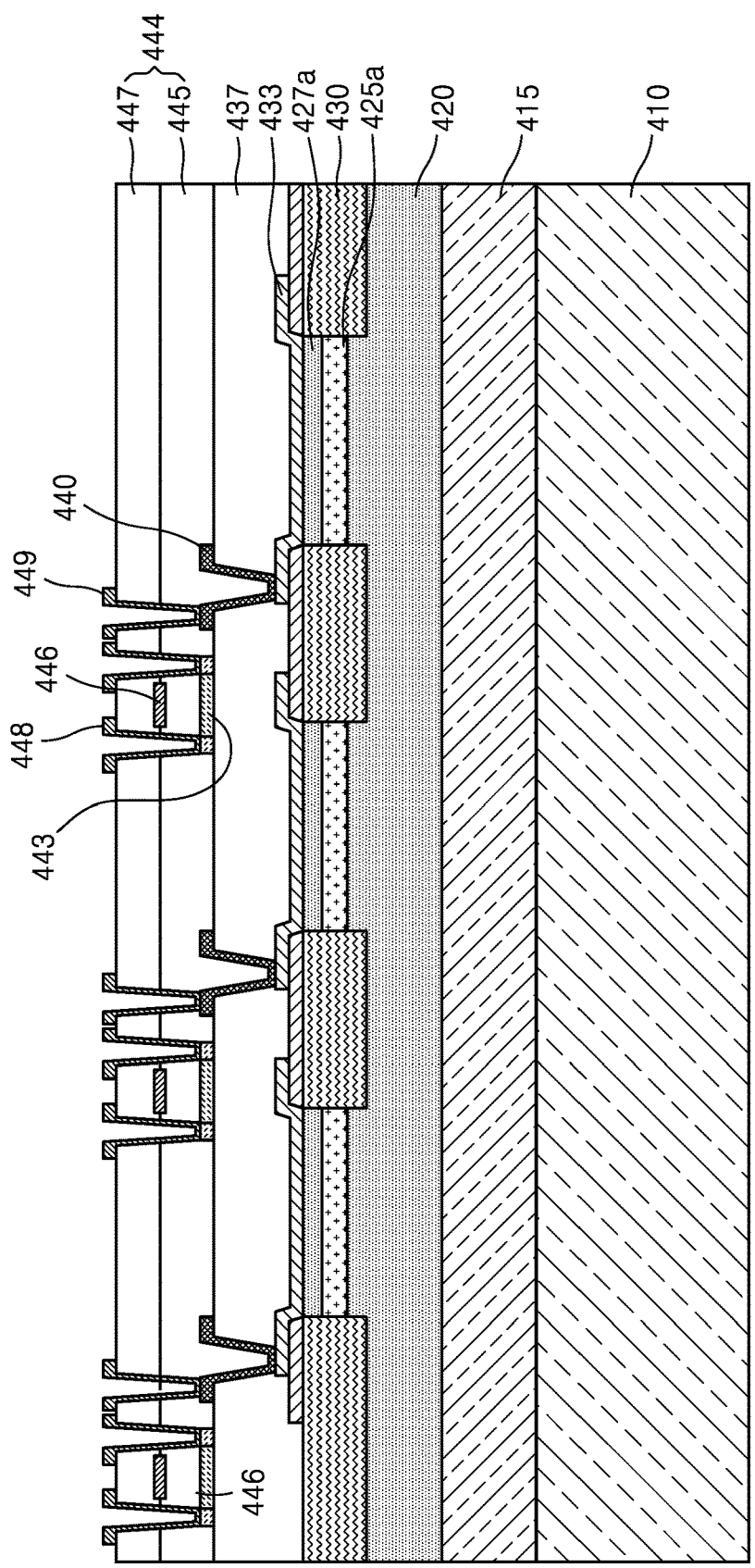

Referring to FIG. 13, a second insulating layer 445 may be formed on the first insulating layer 437, and a gate electrode 446 may be formed in the second insulating layer 445. A third insulating layer 447 may be formed on the second insulating layer 445 and the gate electrode 446. A source electrode 448 and a drain electrode 449 may be formed by etching the second insulating layer 445 and the third insulating layer 447. The gate electrode 446, the source electrode 448, and the drain electrode 449 may constitute a driving element. Here, a method of forming a TFT as an example of a driving element is described. The source electrode 448 may be connected to the electrode pad 443, and the drain electrode 449 may be connected to the via hole 440. In this manner, a driving layer 444 may be formed. For instance, the second insulating layer 445, the gate electrode 446, the third insulating layer 447, the source electrode 448 and the drain electrode 449 may form the driving layer 444.

Figure 14:
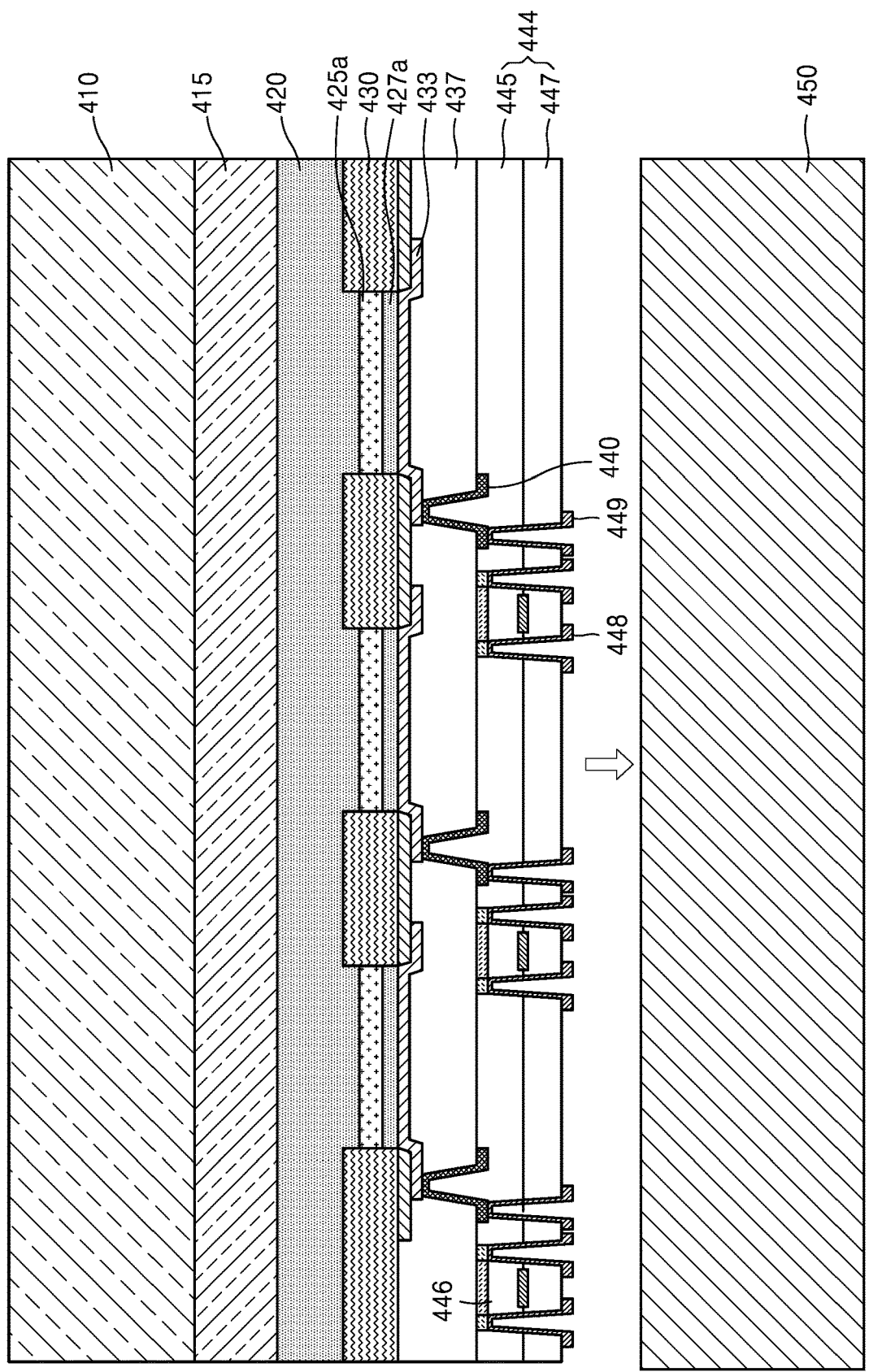

Referring to FIG. 14, the structure illustrated in FIG. 13 may be turned upside down so that the epitaxial substrate 410 faces upward, and the structure may be disposed so that the third insulating layer 447 faces the support substrate 450. The support substrate 450 is a substrate that supports the structure illustrated in FIG. 13. Examples of the support substrate 450 may include a silicon substrate, a glass substrate, a sapphire substrate, and a silicon substrate coated with $SiO_2$. However, this is merely an example, and various materials that are easy to bond to the third insulating layer 447 may be used. The support substrate 450 and the third insulating layer 447 may be bonded by a bonding layer 455. The bonding layer 455 may include, for example, an adhesive layer or a direct bonding layer. The support substrate 450 does not require electrical connection and supports the structure, and the support substrate 450 and the structure may be physically connected by simple bonding. The bonding layer 455 may have a thickness in a range of, for example, about 0.1 nm to about 10 μm.

After bonding the support substrate 450 to the structure, the epitaxial substrate 410 may be removed. The epitaxial substrate 410 may be removed by, for example, a laser lift-off process or a polishing process. The polishing process may be used together with a dry etching process. For example, when the epitaxial substrate 410 is a sapphire substrate, the epitaxial substrate 410 may be removed by a laser lift-off process, and when the epitaxial substrate 410 is a silicon substrate, the epitaxial substrate 410 may be removed by a polishing process.

Figure 15:
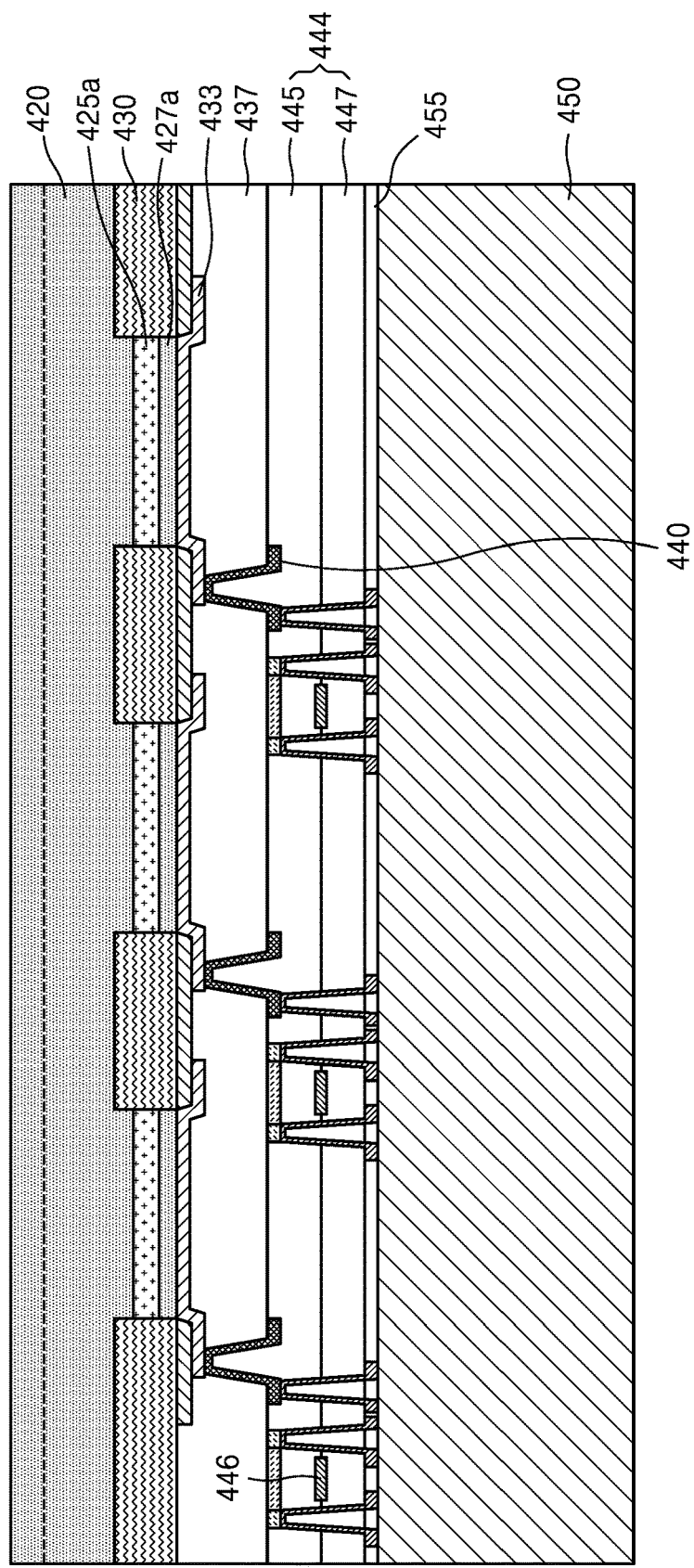

The buffer layer 415 may be selectively removed. FIG. 15 illustrates an example in which the buffer layer 415 is removed. The first semiconductor layer 420 may be etched to reduce the thickness thereof. For example, the first semiconductor layer 420 may have a thickness in a range of about 0.5 μm to about 3.0 μm.

Figure 16:
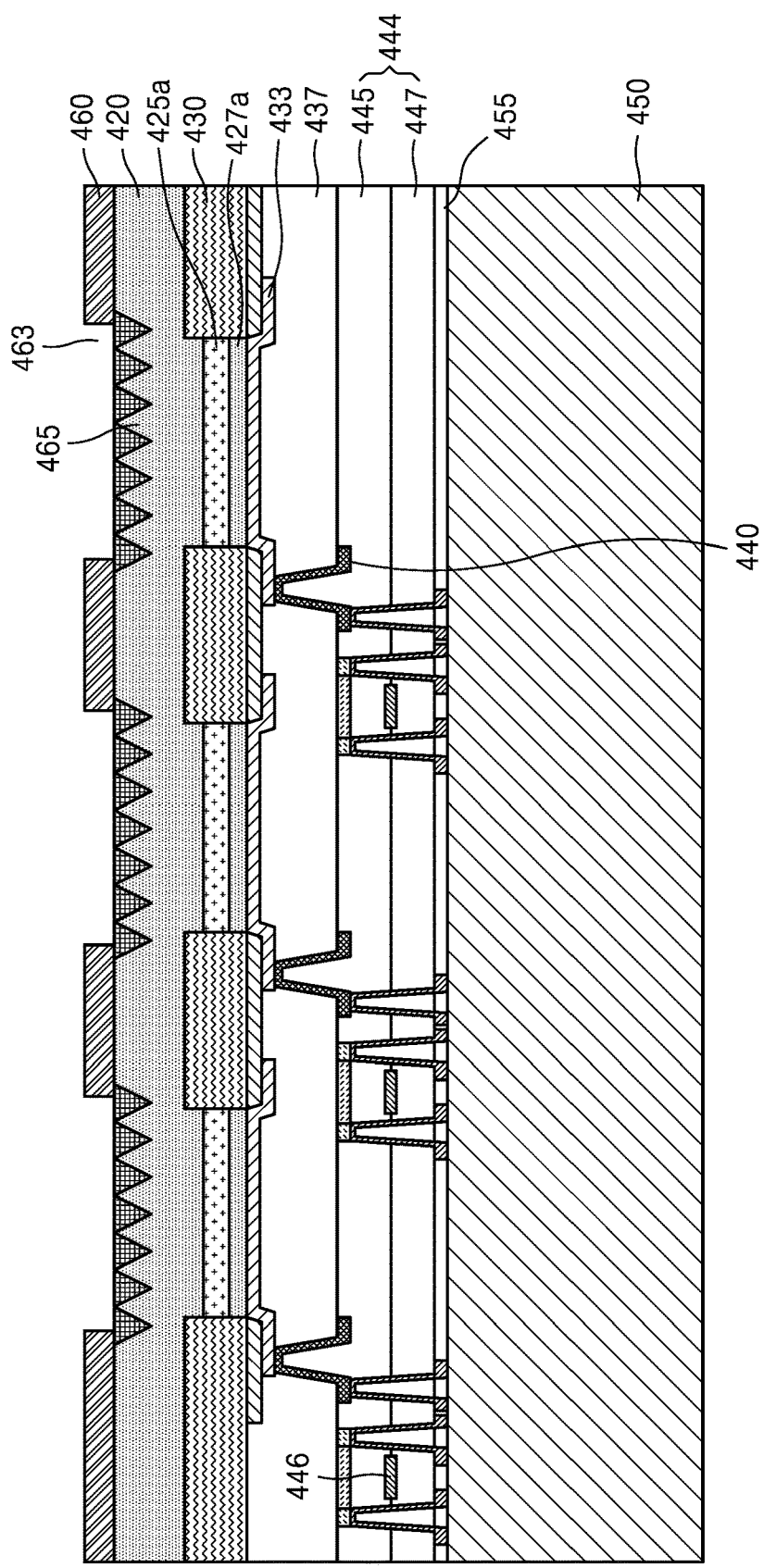

Referring to FIG. 16, a fine pattern structure 465 may be formed on the first semiconductor layer 420 by a wet etching process. The fine pattern structure 465 may be formed corresponding to a region in which light is emitted. For example, the fine pattern structure 465 may be formed at a position corresponding to the active layer 427*a*. The fine pattern structure 465 may increase light extraction efficiency. A second electrode 460 may be formed on the first semiconductor layer 420. The second electrode 460 may be formed as an opaque electrode. When the second electrode 460 is an opaque electrode, the second electrode 460 may be etched to form a window region 463 so that light is emitted.

Figure 17:
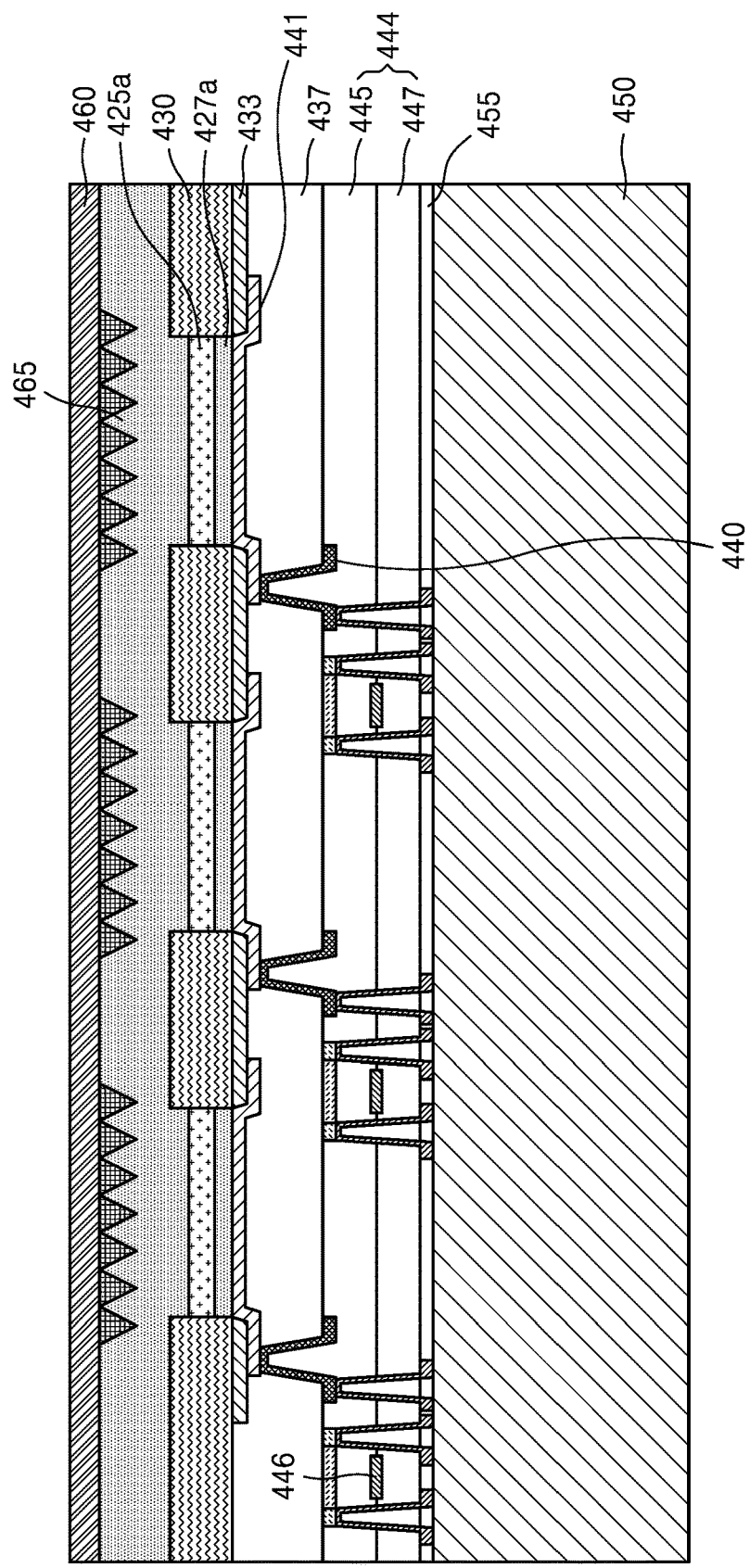
FIG. 17 illustrates a method of forming a transparent electrode in the display device, according to an embodiment.

FIG. 17 illustrates an example in which the second electrode 460 is formed as a transparent electrode, unlike in FIG. 16. The second electrode 460 may include, for example, ITO, ZnO, IZO, or IGZO. When the second electrode 460 is a transparent electrode, the second electrode 460 may be disposed to completely cover the second semiconductor layer 420. Since light passes through the transparent electrode, a window region is not required. The second electrode 460 may be a common electrode. Since the structure of the second electrode 470 is simple, the second electrode 460 may be easily manufactured and the manufacturing error may be reduced. In addition, since the driving layer including the TFT is disposed below the active layer 427a and the second electrode 460 serving as the common electrode is disposed above the active layer 427a, it is possible to easily secure a region in which light is emitted. In addition, the first electrode 441 is disposed below the active layer 427a so that light emitted downward from the active layer 427a is reflected upward by the first electrode 441, thereby increasing the efficiency of outgoing light.

Figure 18:
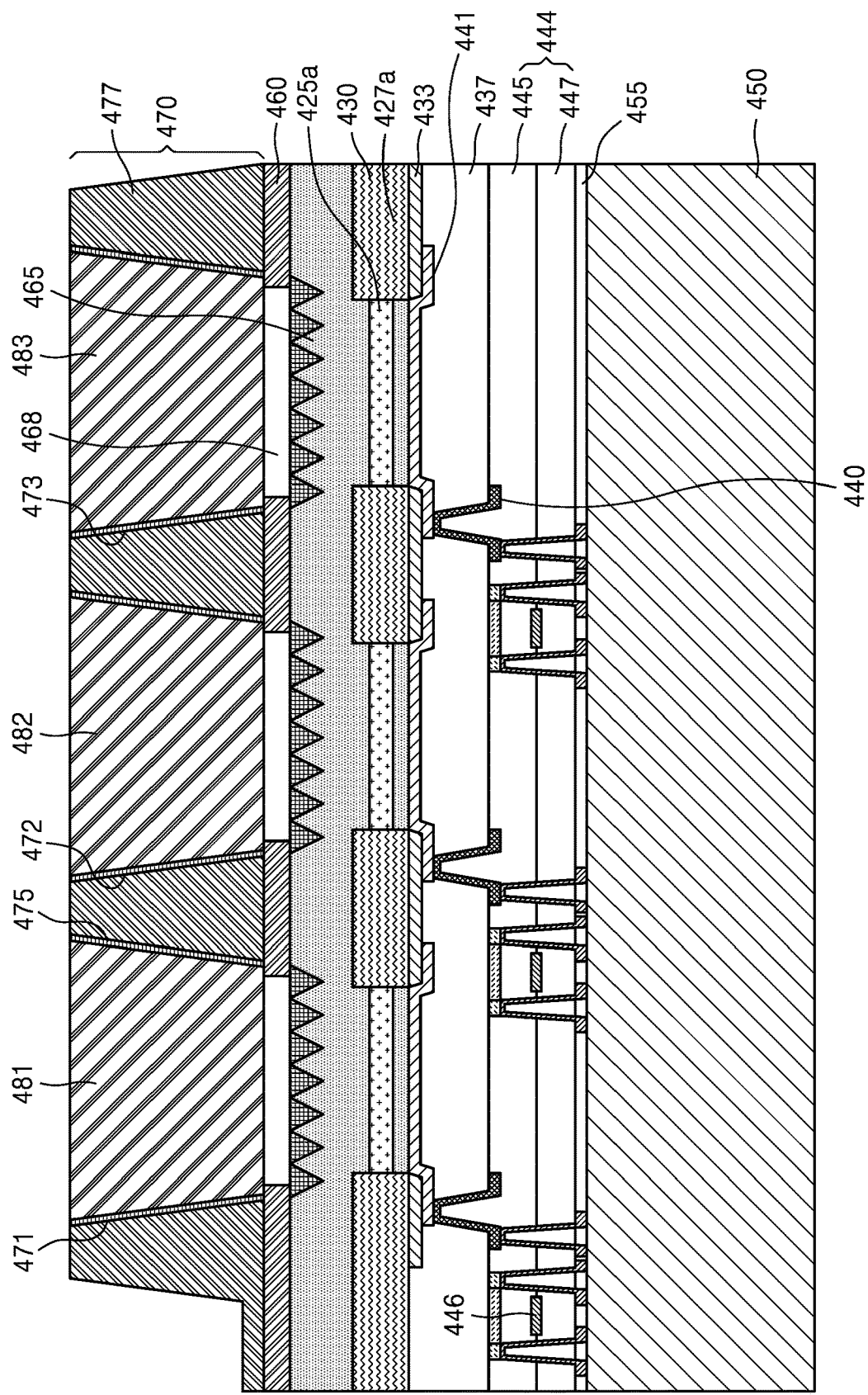
FIG. 18 illustrates a method of forming a color conversion layer on a structure illustrated in FIG. 16.

Referring to FIG. 18, a plurality of color conversion layers, for example, first, second, and third color conversion layers 481, 482, and 483, may be formed on the second electrode 460. The first, second, and third color conversion layers 481, 482, and 483 may be partitioned by partition walls 477. A partition wall layer 470 may be stacked on the second electrode 460, a first hole 471 for a first color conversion layer 481 may be formed by using a first mask (not illustrated), and the first color conversion layer 481 may be deposited on the first hole 471. Before the first color conversion layer 481 is deposited, a reflective film 475 may be further formed on the sidewall of the first hole 471. Subsequently, a second hole 472 for the second color conversion layer 482 may formed by using a second mask (not illustrated), and the second color conversion layer 482 may be deposited on the second hole 472. Before the second color conversion layer 482 is deposited, a reflective film 475 may be further formed on the sidewall of the second hole 472. In addition, a third hole 473 for the third color conversion layer 483 may formed by using a third mask (not illustrated), and a third color conversion layer 483 may be deposited on the third hole 473. Before the third color conversion layer 483 is deposited, a reflective film 475 may be further formed on the sidewall of the third hole 472. Through the above procedures, the partition walls 477 may be formed between the adjacent color conversion layers.

Figure 19:
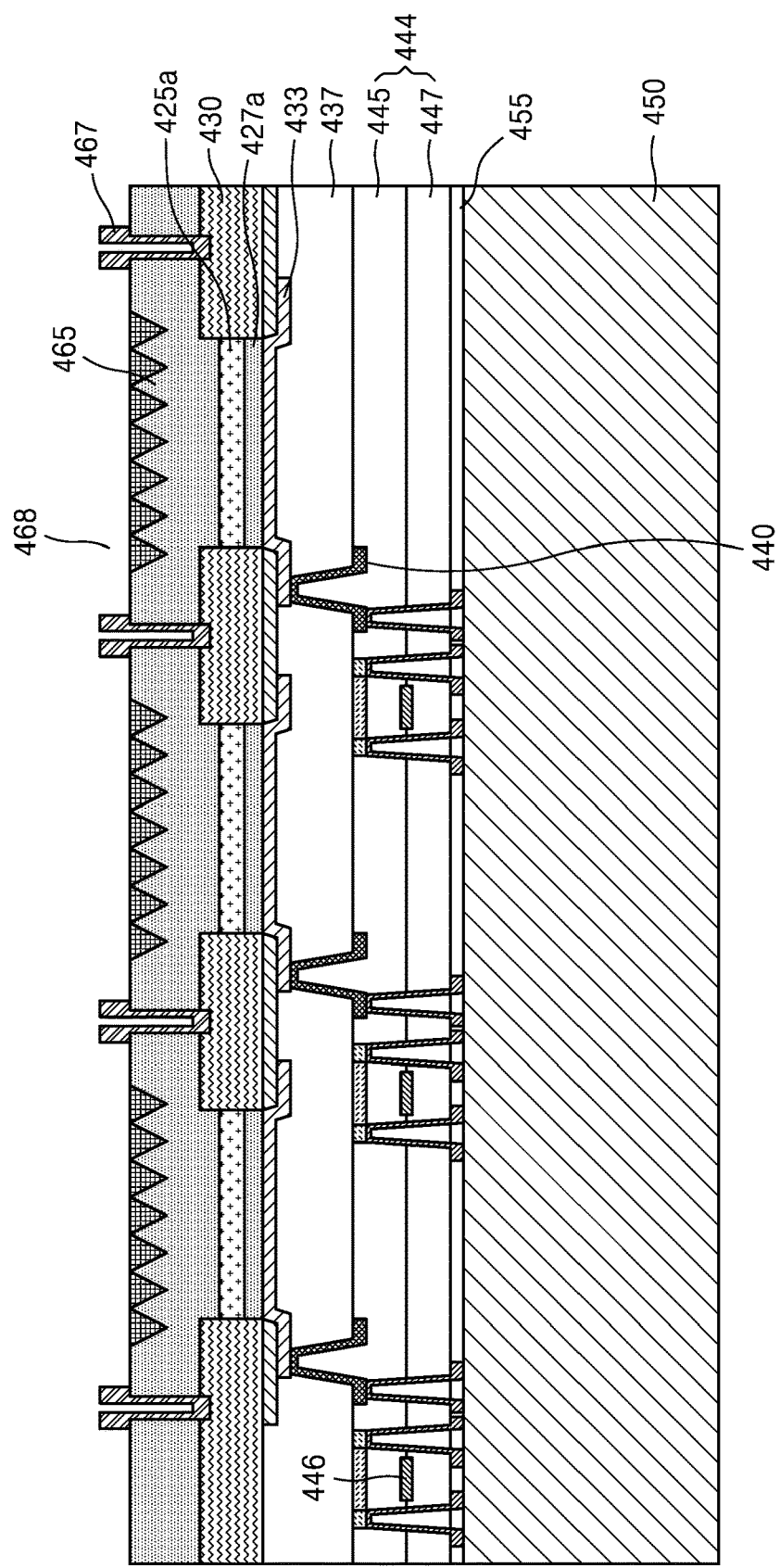
FIGS. 19 and 20 illustrate a method of manufacturing a display apparatus, according to another embodiment.

Next, FIG. 19 illustrates a method of forming a second electrode 467 having a trench structure. In the structure illustrated in FIG. 15, a fine pattern structure 465 is formed in the second semiconductor layer 420, and the second semiconductor layer 420 is etched to form a trench 466. A second electrode 457 and a window region 468 may be formed by depositing a conductive material on the second semiconductor layer 420 and etching the second semiconductor layer 420. The second electrode 457 may have a trench structure. For example, the second electrode 457 may have a depth so that the second electrode 457 is in contact with the isolation structure 430. The second electrode 457 may include a reflective and conductive material and may serve as a reflective layer that reflects light emitted laterally in the active layer 427a.

Figure 20:
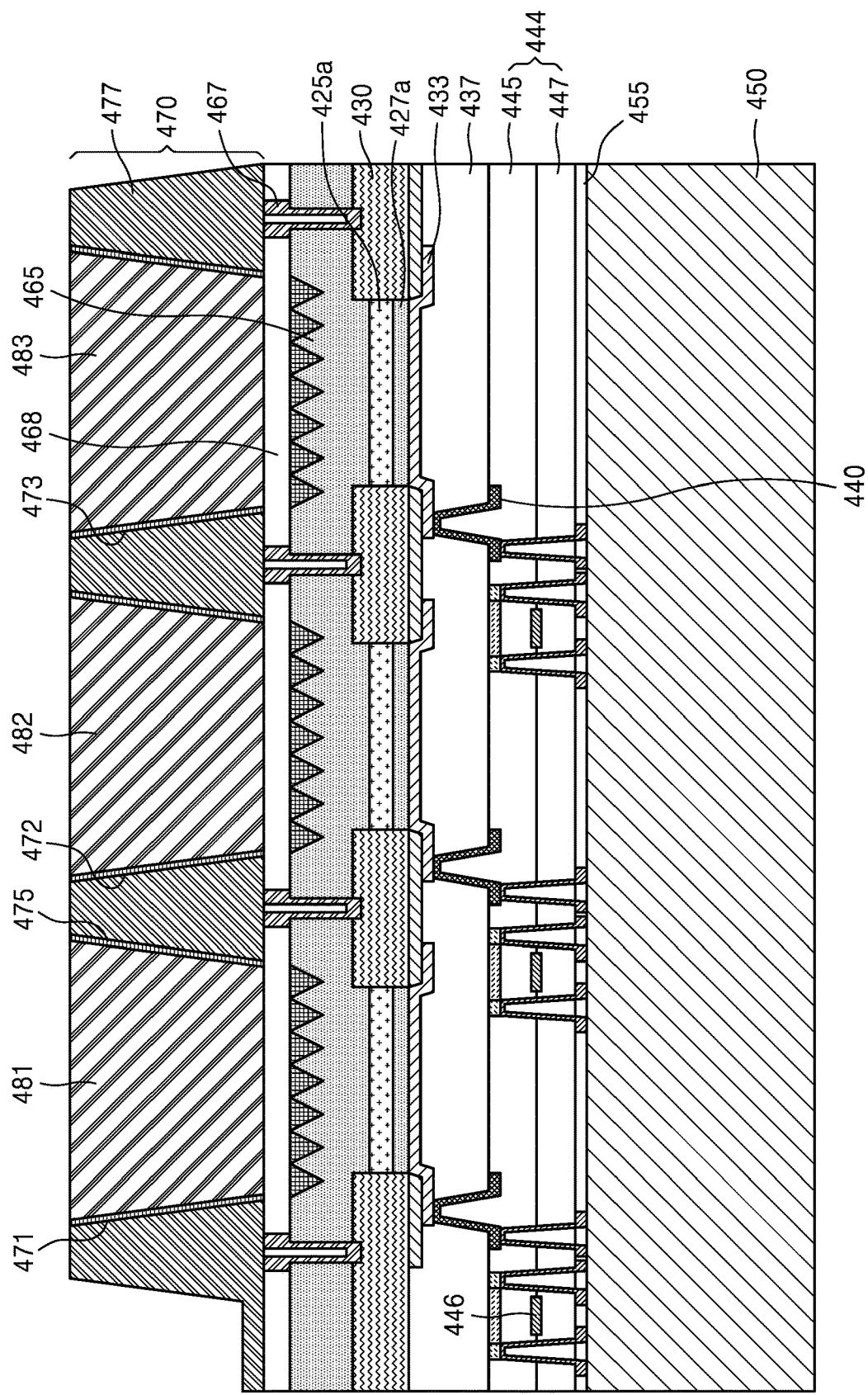

Referring to FIG. 20, a plurality of color conversion layers 481, 482, and 483 may be formed on the second electrode 467. Since a method of manufacturing the color conversion layers 481, 482, and 483 is substantially the same as described with reference to FIG. 18, detailed descriptions thereof will be omitted here.

The driving layer and the light-emitting layer may be monolithically formed according to the display manufacturing method according to the embodiment. In addition, a vertical electrode structure without a mesa structure may be formed through a flip manufacturing process in which an epitaxial substrate is turned upside down according to the display manufacturing method according to the embodiment. The manufacturing process may be simplified by reducing the via hole etching process for forming the electrode. Since there is no mesa structure, it is possible to prevent the internal quantum efficiency from being reduced due to the mesa structure. In addition, since at least one selected from the first electrode and the second electrode serves as a reflective film, the luminous efficiency may be improved.

According to an embodiment, there is provided a semiconductor device having a support substrate, a driving layer and a light emitting layer. The driving layer may be provided on the support substrate in a flip chip manner. According to an embodiment, the driving layer may include a plurality of driving elements, and each of the plurality of driving elements may be configured to drive a subpixel, among a plurality of subpixels. According to an embodiment, the light-emitting layer provided on the driving layer, and the light emitting layer may be divided into the plurality of subpixels.

According to an embodiment, there is provided a method of forming a monolithic semiconductor device. The method may include forming a light-emitting layer, the light emitting layer being divided into the plurality of subpixels, forming a driving layer on the light emitting layer, the driving layer comprising a plurality of driving elements, each on of the plurality of driving elements configured to drive a subpixel, among a plurality of subpixels; and bonding the driving layer to a support substrate using a flip chip method.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:
1. A display apparatus comprising:
   a support substrate;
   a driving layer provided on the support substrate and comprising a driving element;
   a light-emitting layer comprising a first semiconductor layer, an active layer, and a second semiconductor layer stacked on the driving layer, the light-emitting layer having an ion implantation region configured to divide light emitted from the active layer into a plurality of subpixels;
   a first electrode electrically connected to the first semiconductor layer; and
   a second electrode electrically connected to the second semiconductor layer.

2. The display apparatus of claim 1, further comprising a bonding layer provided between the support substrate and the driving layer.

3. The display apparatus of claim 1, wherein the second electrode comprises a common electrode.

4. The display apparatus of claim 1, wherein the second electrode comprises a transparent electrode and disposed to cover the second semiconductor layer.

5. The display apparatus of claim 1, wherein the second electrode comprises:
  an opaque electrode; and
  a window region configured to transmit light emitted from the active layer.

6. The display apparatus of claim 1, wherein the second electrode comprises a trench structure provided between adjacent subpixels, among the plurality of subpixels.

7. The display apparatus of claim 6, wherein the trench structure of the second electrode is configured to reflect light emitted laterally from the active layer.

8. The display apparatus of claim 6, wherein, in a cross-sectional view, a bottom of the trench structure of the second electrode is above a surface of the active layer facing the second semiconductor layer.

9. The display apparatus of claim 1, further comprising a plurality of color conversion layers configured to convert light emitted from the light-emitting layer into different color lights.

10. The display apparatus of claim 2, wherein the bonding layer is provided directly between the support substrate and the driving layer.

* * * * *